(12) United States Patent
Tanaka et al.

(10) Patent No.: US 8,154,014 B2
(45) Date of Patent: Apr. 10, 2012

(54) ORGANIC THIN FILM TRANSISTOR AND ORGANIC THIN FILM LIGHT-EMITTING TRANSISTOR

(75) Inventors: Ichiro Tanaka, Osaka (JP); Hideji Osuga, Osaka (JP)

(73) Assignee: Idemitsu Kosan, Co., Ltd., Tokyo (JP)

( * ) Notice: Subject to any disclaimer, the term of this patent is extended or adjusted under 35 U.S.C. 154(b) by 225 days.

(21) Appl. No.: 12/675,474

(22) PCT Filed: Aug. 29, 2008

(86) PCT No.: PCT/JP2008/065525
§ 371 (c)(1),
(2), (4) Date: Feb. 26, 2010

(87) PCT Pub. No.: WO2009/028660
PCT Pub. Date: Mar. 5, 2009

(65) Prior Publication Data
US 2010/0244000 A1    Sep. 30, 2010

(30) Foreign Application Priority Data

Aug. 30, 2007 (JP) ................. 2007-223575

(51) Int. Cl.
*H01L 51/30* (2006.01)
*H01L 51/40* (2006.01)
(52) U.S. Cl. ......................................... 257/40
(58) Field of Classification Search ............. 257/40–43, 257/E51.006, E51.007
See application file for complete search history.

(56) References Cited

U.S. PATENT DOCUMENTS 7,902,547 B2 * 3/2011 Aoki ............................. 257/40

(Continued)

FOREIGN PATENT DOCUMENTS

JP         7-221367 A      8/1995

(Continued)

OTHER PUBLICATIONS

Yamaguchi, Kazuki et al. "Organic Field-Effect Transistors Based on Benzodithiophene-Dimer Films." (Japanese Journal of Applied Physics), Jul. 20, 2007, L727-L729, 46:29.

(Continued)

*Primary Examiner* — Cuong Q Nguyen
(74) *Attorney, Agent, or Firm* — Millen, White, Zelano & Branigan, P.C.

(57) ABSTRACT

The present invention aims to provide an organic thin film transistor that is superior in stability in the atmosphere and that has a high operation speed. The organic thin film transistor according to the present invention includes three kinds of terminals consisting of a gate electrode, a source electrode, and a drain electrode, an insulator layer that insulates the gate electrode from the source electrode and from the drain electrode, and an organic semiconductor layer; the terminals, the insulator layer, and the organic semiconductor layer being disposed on a substrate; the organic thin film transistor controlling a source-to-drain electric current by a voltage applied to the gate electrode, and the organic thin film transistor is characterized by further including a crystallinity control layer that is formed from a crystalline compound that controls crystallinity of the organic semiconductor layer, and is characterized in that the organic semiconductor layer is formed on the crystallinity control layer and contains a compound having heterocyclic groups or a compound having a quinone structure. The organic thin film light-emitting transistor according to the present invention is characterized in that either one of the source electrode and the drain electrode of the organic thin film transistor is formed of a hole-injecting electrode, and the other electrode is formed of an electron-injecting electrode.

11 Claims, 5 Drawing Sheets

U.S. PATENT DOCUMENTS

| | | |
|---|---|---|
| 2006/0237731 A1 | 10/2006 | Furukawa et al. |
| 2007/0034860 A1 | 2/2007 | Nakamura |
| 2008/0042129 A1 | 2/2008 | Nakagawa et al. |
| 2009/0072224 A1* | 3/2009 | Aramaki et al. ............... 257/40 |
| 2009/0146138 A1* | 6/2009 | Aoki ............................ 257/40 |
| 2009/0236596 A1* | 9/2009 | Itai .............................. 257/43 |
| 2010/0148154 A1* | 6/2010 | MacGillivray et al. ......... 257/40 |

FOREIGN PATENT DOCUMENTS

| | | |
|---|---|---|
| JP | 7-221367 W | 8/1995 |
| JP | 2005-032978 A | 2/2005 |
| JP | 2006-179703 A | 7/2006 |
| JP | 2006-324655 A | 11/2006 |
| WO | PCTJP0865525 R | 12/2008 |

OTHER PUBLICATIONS

Yamane, K., et al. "Ambipolar organic light emitting field effect transistors with modified asymmetric electrodes" Applied Physics Letter 90, 162108 (2007).

\* cited by examiner

ORGANIC THIN FILM TRANSISTOR AND ORGANIC THIN FILM LIGHT-EMITTING TRANSISTOR

TECHNICAL FIELD

This invention relates to an organic thin film transistor having more excellent stability in the atmosphere and having high operation speed than conventional transistors, and relates to an organic thin film light-emitting transistor using this organic thin film transistor.

BACKGROUND ART

A thin film transistor (hereinafter, referred to acronymously as a "TFT") has been widely used as a switching device for display of, for example, a liquid crystal display device. The cross-sectional structure of a typical TFT is shown in FIG. 11. The TFT of FIG. 11 has a gate electrode, an insulator layer, and an organic semiconductor layer formed on a substrate in this order, and has a source electrode and a drain electrode formed with a predetermined distance therebetween on the organic semiconductor layer. In the thus structured TFT, the organic semiconductor layer serves as a channel region, so that an electric current flowing between the source electrode and the drain electrode is controlled by a voltage applied to the gate electrode, and, as a result, the TFT performs an on-off operation.

Conventionally, this TFT has been made of amorphous or polycrystalline silicon. However, a conventional problem resides in the fact that a CVD apparatus used to manufacture TFTs using such silicon is highly costly, and hence a great increase in manufacturing costs is caused when a display device using TFTs or a similar device is made large in size. Another conventional problem resides in the fact that a process for making a film of amorphous or polycrystalline silicon is performed at a very high temperature, and therefore limitations are imposed on the kind of material usable as a substrate, and therefore, for example, a resin substrate cannot be used although the resin substrate is light in weight.

To solve these problems, a TFT that uses organic substances instead of amorphous or polycrystalline silicon has been proposed. A vacuum deposition method, an application method, etc., are known as film-forming methods employed when TFTs are formed of organic substances, and, according to these film-forming methods, the device can be made large in size while curbing an increase in manufacturing costs, and a process temperature required during a film-forming process can be made comparatively low. Therefore, a TFT that uses organic substances has the advantage of being small in limitations imposed when material to be used for a substrate is selected, and this TFT is expected to come into practical use. Examples of TFTs using these organic substances are shown in, for example, Non-Patent Literatures 1-4 in a list below. Examples of organic substances used for an organic-compound layer of a TFT include a multimeric complex, such as conjugated polymer or thiophene (see Patent Literature 1 shown below), and a condensed aromatic hydrocarbon, such as pentacene (see Patent Literature 2 shown below), which are p-type substances. Examples of organic substances used for an n-type field-effect transistor (i.e., n-type FET) include 1,4,5,8-naphthalene tetracarboxylic dianhydride (NTCDA), 11,11,12,12-tetracyanonaphtho-2,6-quinodimethane (TCN-NQD), and 1,4,5,8-naphthalene tetracarboxylic diimide (NTCDI), which are disclosed by Patent Literature 3 shown below.

On the other hand, an organic electroluminescence (EL) device is known as a device that uses electric conduction in the same way. The organic EL device is generally structured so that an intense electric field of $10^5$ V/cm or more is applied in the direction of the film thickness of an ultra-thin film of 100 nm or less so as to allow an electric charge to forcibly flow, whereas the organic TFT is required to allow an electric charge to flow at high speed in an electric field of $10^5$ V/cm or less over a distance of a few microns (μm) or more, and hence is required to allow its own organic compound to become more conductive. However, organic compounds used for conventional organic TFTs are small in field-effect mobility, are low in operation speed, and have the conventional problem of being inferior in high-speed responsiveness that is a necessary characteristic of a transistor. Still another conventional problem is that the on/off ratio of the transistor is small. The term "on/off ratio" mentioned here denotes a value obtained by dividing an electric current flowing between a source and a drain when a gate voltage is applied (i.e., in an ON state) by an electric current flowing between the source and the drain when a gate voltage is not applied (i.e., in an OFF state). Ordinarily, the "ON-state current" denotes a current value (i.e., saturation current) obtained when a gate voltage is gradually increased, and, as a result, an electric current flowing between the source and the drain is saturated.

REFERENCE LIST

Patent Literature 1: Japanese Unexamined Patent Publication No. H8-228034
Patent Literature 2: Japanese Unexamined Patent Publication No. H5-55568
Patent Literature 3: Japanese Unexamined Patent Publication No. H10-135481
Non-Patent Literature 1: C. D. Dimitrakopoulos et al., IBM J. RES. & DEV., Vol. 45, No. 1, Page 11, 2001
Non-Patent Literature 2: Horowitz et al., Advanced Materials, Vol. 8, No. 3, Page 242, 1996
Non-Patent Literature 3: H. Fuchigami et al., Applied Physics Letter, Vol. 63, Page 1372, 1993
Non-Patent Literature 4: Lay-Lay Chua et al., Nature, Vol. 434, Mar. 10, 2005 issue, Page 194

DISCLOSURE OF INVENTION

Problems to be Solved by the Invention

On the other hand, compounds conventionally used for an organic TFT device have the drawback of lacking stability in the atmosphere. As an example, a product using a pentacene thin film is known as a typical organic semiconductor thin film showing the highest carrier mobility, and, however, has the drawbacks of becoming smaller in carrier mobility and becoming remarkably smaller in on/off ratio if it is kept in the atmosphere, and therefore is expected to overcome these drawbacks.

On the other hand, two examples in each of which a film is formed by placing rubrene on pentacene are known. One of the two examples is a non-patent document (J. H. Seo et al., Applied Physics Letters, Vol. 89, Page 163505, 2006) that discloses an organic thin film transistor including a laminated structure of pentacene (10 nm)/rubrene (40 nm). In this example, a pentacene film of 10 nm is formed, and then a continuous film is formed, and, as a result, this pentacene is provided with a channel. The mobility of pentacene is observed in the organic TFT mentioned above. The other example is a non-patent document (M. Haemori et al., Japanese Journal of Applied Physics, Vol. 44, Page 3740, 2005) that discloses an organic thin film transistor including a laminated structure of pentacene/rubrene (23 nm). This organic thin film transistor is smaller in mobility than a TFT using only pentacene or only rubrene.

The present invention has been made to solve the above-mentioned problems, and it is an object of the present invention to provide an organic TFT that has more excellent stability in the atmosphere and that is high in operation speed than a conventional TFT.

Means for Solving the Problems

To achieve this object, the present inventors have continued research diligently, and, as a result, have discovered that operation speed can be heightened, and the TFT can be stably kept in the atmosphere by forming an organic semiconductor layer on a crystallinity control layer that controls the crystallinity of the organic semiconductor layer, thus having completed the present invention.

In detail, the present invention provides an organic thin film transistor which includes three kinds of terminals consisting of a gate electrode, a source electrode, and a drain electrode, an insulator layer that insulates the gate electrode from the source electrode and from the drain electrode, and an organic semiconductor layer; the terminals, the insulator layer, and the organic semiconductor layer being disposed on a substrate; the organic thin film transistor controlling an electric current flowing between the source electrode and the drain electrode by a voltage applied to the gate electrode; the organic thin film transistor being characterized by further including a crystallinity control layer made of a crystalline compound that controls the crystallinity of the organic semiconductor layer and characterized in that the organic semiconductor layer contains a heterocyclic compound or a quinone compound disposed on the crystallinity control layer.

The present invention additionally provides an organic thin film light-emitting transistor characterized by having a structure of the organic thin film transistor and by forming either the source electrode or the drain electrode of the organic thin film transistor as a hole-injecting electrode and forming the remaining electrode as an electron-injecting electrode.

Effects of the Invention

According to the organic thin film transistor of the present invention, the crystallinity control layer improves the crystalline order of the organic semiconductor layer while controlling the crystallinity of the organic semiconductor layer formed on the crystallinity control layer, and therefore carrier mobility can be enhanced. Additionally, molecular packing becomes tight, and atmospheric constituents are prevented from passing through the layers, and therefore stability in the atmosphere can be improved. This makes it possible to provide a high-performance transistor whose operation speed is enhanced and that has excellent stability in the atmosphere. Additionally, the organic thin film transistor of the present invention is high in operation speed, and therefore is applied also to the organic thin film light-emitting transistor in a suitable manner.

DESCRIPTION OF REFERENCE NUMERALS

Figure 1:
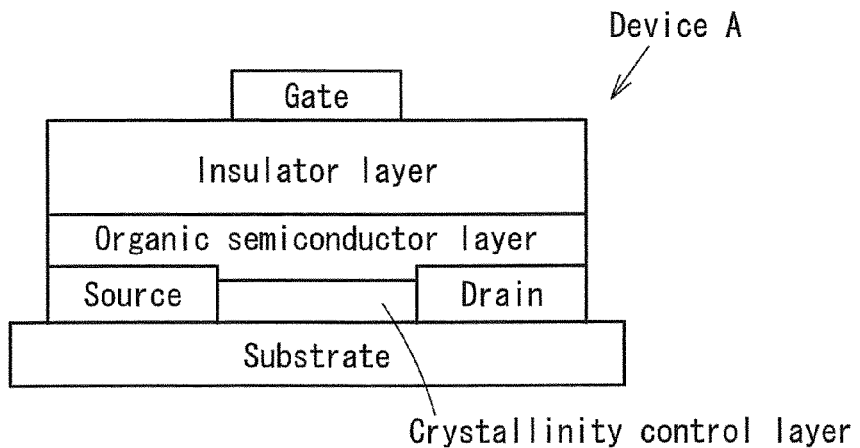
FIG. 1 is a view showing a device structure of an organic TFT according to an embodiment of the present invention.
Figure 2:
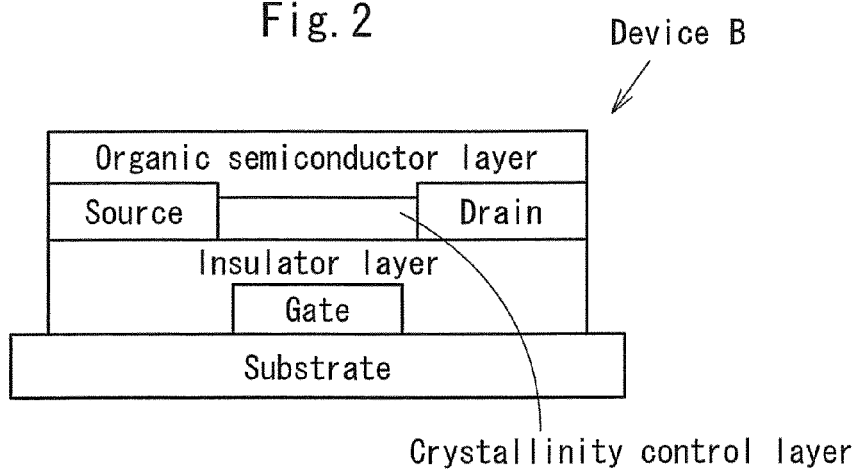
FIG. 2 is a view showing a device structure of an organic TFT according to another embodiment of the present invention.

12 Substrate
13 Substrate
14 Insulator layer
15 Crystallinity control layer
16 Organic semiconductor layer
17 Metal mask
18 Hole-injecting electrode
19 Electron-injecting electrode
20 Organic thin film light-emitting transistor
G Grain

BEST MODE FOR CARRYING OUT THE INVENTION

A detailed description will be hereinafter given of embodiments of an organic thin film transistor (hereinafter, referred to acronymously as a "TFT") according to the present invention.

[1. Basic Device Structure]:

Specific limitations are not imposed on the device structure of the organic TFT of the present invention as long as the TFT is structured such that three kinds of terminals consisting of a gate electrode, a source electrode, and a drain electrode, an insulator layer, a crystallinity control layer, and an organic semiconductor layer are disposed on a substrate, such that the organic semiconductor layer is laid on the crystallinity control layer, and such that a source-drain electric current is controlled by applying a voltage to the gate electrode. The TFT may be also based on a well-known device structure. The present invention is characterized in that the crystallinity control layer is disposed as an underlay for the organic semiconductor layer before disposing the organic semiconductor layer, and then the organic semiconductor layer is laid thereon in this order. Constituent devices A to D of the present invention based on the basic device structure of a typical organic TFT are shown in FIGS. 1 to 4. As shown therein, several well-known basic structures are known according to positions of the electrodes or an order in which the layers are laid on each other, and the organic TFT of the present invention has a field-effect transistor (FET) structure. The organic TFT includes an organic semiconductor layer (organic compound layer), a source electrode and a drain electrode both of which are disposed to face each other with a predetermined distance therebetween, and a gate electrode disposed such that at least an insulator layer is placed between the gate electrode and both of the source and drain electrodes, and the organic TFT controls an electric current flowing between the source electrode and the drain electrode by applying a voltage to the gate electrode. Herein, the distance between the source electrode and the drain electrode depends on the intended use of the organic TFT of the present invention, and is usually 0.1 μm to 1 mm, preferably 1 μm to 100 μm, and more preferably 5 μm to 100 μm.

Figure 3:
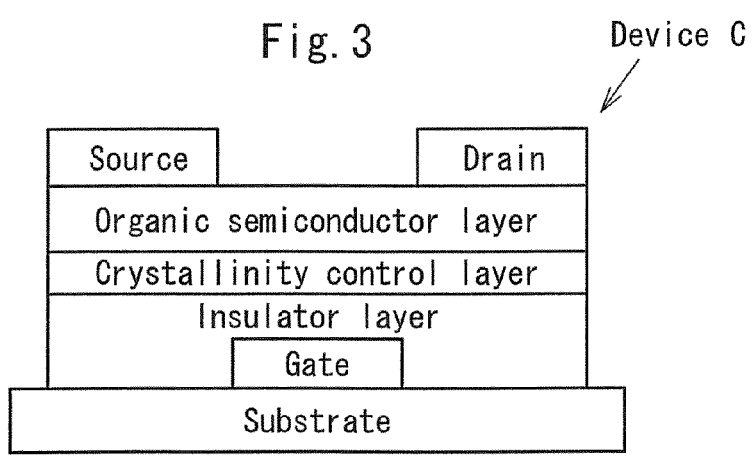
FIG. 3 is a view showing a device structure of an organic TFT according to still another embodiment of the present invention.

The device C of FIG. 3 among the devices A to D will be described in detail as an example. The organic TFT of the device C includes a gate electrode, an insulator layer, a crystallinity control layer, and an organic semiconductor layer on a substrate in this order, and additionally includes a source electrode and a drain electrode, which serve as a pair and which are placed with a predetermined distance therebetween, on the organic semiconductor layer. The organic semiconductor layer serves as a channel region, and an electric current flowing between the source electrode and the drain electrode is controlled by a voltage applied to the gate electrode, and, as a result, the device performs an on-off operation.

Figure 5:
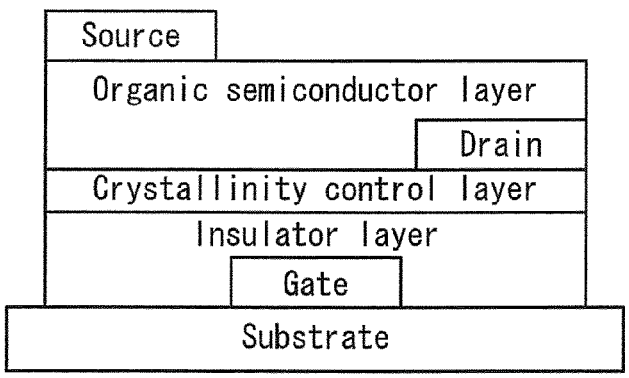
FIG. 5 is a view showing a device structure of an organic TFT according to still another embodiment of the present invention.
Figure 6:
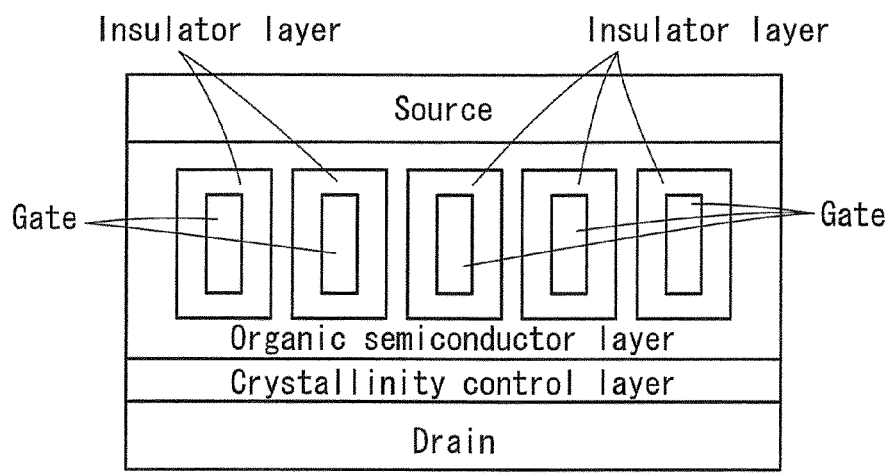
FIG. 6 is a view showing a device structure of an organic TFT according to still another embodiment of the present invention.

Various structures have been proposed as that of an organic TFT in addition to the device structure of each of the devices A to D mentioned above, and the organic TFT of the present invention is not limited to the device structures of the devices A to D if the organic TFT has a mechanism according to which effects, such as on-off operation and amplification, are brought about by controlling an electric current flowing between the source electrode and the drain electrode by means of a voltage applied to the gate electrode. For example, the basic structure may have a device structure, such as that of a top and bottom contact type organic TFT (see FIG. 5) proposed in Preprints 27a-M-3 (March, 2002) of the 49th meeting of Japan Society of Applied Physics and Related Societies by Yoshida, et al. of the National Institute of Advanced Industrial Science and Technology or that of a vertical type organic TFT (see FIG. 6) proposed in Journal 118-A (1998) page 1440 of Institute of Electrical Engineers of Japan by Kudo et al. of Chiba University, and a crystallinity control layer may be first disposed as an underlay used for an organic semiconductor layer, and then an organic semiconductor layer may be laid thereon.

[2. Crystallinity Control Layer]:

[1. Function of Crystallinity Control Layer];

The function of the crystallinity control layer is to improve crystallinity (order degree) while controlling the crystallinity of the organic semiconductor layer disposed thereon, and, as a result, to improve carrier mobility and to make molecular packing tight, thereby preventing atmospheric constituents from passing therethrough so as to improve stability in the atmosphere.

[2. Material Used for Crystallinity Control Layer];

Preferably, a material used for the crystallinity control layer has its grains that grow not only in the direction perpendicular to the surface of the substrate but also in the direction parallel to the surface thereof although no specific limitations are imposed if grains can be formed during a film-forming process. If grains highly grow only in the direction perpendicular to the surface of the substrate, the concavo-convex shape of a channel part of the organic semiconductor film that grows thereon will become steep, and, as a result, the flow of an electric current will be blocked, and grains of the organic semiconductor layer will be also affected thereby and grow highly, and therefore film continuity will deteriorate. From these facts, it is preferable to use condensed ring compounds, hetero condensed ring compounds, and aromatic polycyclic compounds, which may have substituents, as a material system used for the crystallinity control layer. Preferably, the carbon number is 6 to 60 in these condensed ring compounds, hetero condensed ring compounds, and aromatic polycyclic compounds. More preferably, the carbon number is 6 to 30, and most preferably, the carbon number is 6 to 20. The reason is that if the number of rings increases, molecules are greatly twisted, and the crystallinity of the crystallinity control layer is impaired. Although concrete examples are mentioned below, the present invention is not limited to these examples.

Examples of the above-mentioned condensed ring compounds include acenes, such as naphthalene, anthracene, tetracene, pentacene, hexacene, and heptacene, which are expressed by general formula (2) shown below.

[Chemical Compound 1]

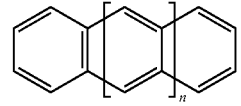

(2)

In general formula (2), n is 2 to 20.

Specifically, the compounds of general formula (2) mentioned above are phenanthrene, chrysene, triphenylene, tetraphene, pyrene, picene, pentaphene, perylene, helicene, and coronene.

Examples of the above-mentioned aromatic polycyclic compounds include biphenyl, terphenyl, quaterphenyl, sexiphenyl, triphenylmethane, and phenolphthalein.

Examples of the above-mentioned hetero condensed ring compounds include quinoline, quinoxaline, naphthylidyne, phenazine, carbazole, diazaanthracene, pyridoquinoline, pyrimidoquinazoline, pyrazinoquinoxaline, phenanthroline, dibenzothiophene, thienothiophene, dithienothiophene, benzodithiophene, dibenzofuran, benzodifuran, dithia-indacene, dithia-indacene, dithia-indenoindene, dibenzoselenophene, diselena-indacene, diselena-indenoindene, and dibenzosilole.

[3. Crystalline Form];

A preferred form of the crystallinity control layer is to, at least, have grains. The strength of the crystallinity of the crystallinity control layer leads to an improvement in crystallinity of the organic semiconductor layer disposed on the crystallinity control layer. In other words, the crystallinity of the organic semiconductor layer can be improved by controlling the size of the grain to be 10 to 0.02 μm, preferably 2 to 0.05 μm. Additionally, to improve crystallinity in the grains that form the crystallinity control layer, a self-assembled monomolecular layer of, for example, octadecyltrichlorosilane (OTS), hexamethyldisilazane (HMDS), fluorine-substituted octadecyltrichlorosilane (PFOTS), β-phenethyltrichlorosilane (β-Phe), or γ-propyltriethoxysilane (APTES) may be beforehand formed on an underlying layer, such as a substrate or a gate insulator, before forming the crystallinity control layer so as to improve the crystallinity of the grains of the crystallinity control layer.

[4. Film Thickness];

No limitations are imposed on film thickness to allow the crystallinity control layer to control the crystallinity of the organic semiconductor layer. However, if the film thickness of the crystallinity control layer is great, the channel of the organic TFT is also formed in the crystallinity control layer depending on a material to be used, and the effect of improving mobility is not produced. Therefore, it is preferable for the crystallinity control layer to have a small film thickness, and preferably the average film thickness is 0.01 to 10 nm, and more preferably the average film thickness is 0.05 to 5 nm. The term "average film thickness" mentioned here denotes an average film thickness calculated by a quartz-crystal oscillation type film-formation monitor or an atomic force microscope (AFM). For example, it has been reported that molecules are piled up with a thickness of 1.4 to 1.5 nm per molecular layer when pentacene is formed on $SiO_2$ (C. D. Dimitrakopoulos, A. R. Brown, and A. Pomp, "Molecular Beam Deposited Thin Films of Pentacene for Organic Field Effect Transistor Applications," J. Appl. Phys. 80, 2501 (1996)). Therefore, if pentacene is used as the crystallinity control layer and if the average film thickness is set to be below the thickness of the single molecular layer, an island structure will appear which has a part in which several molecular layers of pentacene are piled up on the substrate and a part in which no molecular layers are piled up thereon (G. Yoshikawa et al., Surf. Sci. 600 (2006) 2518). As a result of our diligent research in the present invention, it has been discovered that if the crystallinity control layer has the above-mentioned island structure, crystallinity can be improved over the whole of the organic semiconductor layer formed thereon. Additionally, disadvantageously, if an organic semiconductor film is formed directly on the substrate or on the gate insulator in a conventional manner, the surface energy of the underlying layer (i.e., the substrate or the gate insulator) is nonuniform at some places, and therefore transistor performance is low even if an organic semiconductor film is formed thereon. The island structure is a desirable form in the fact that a decrease in mobility, which is caused by a channel formed in the crystallinity control layer and by the flow of an electric current therethrough, can be prevented by allowing a part in which surface energy is well controlled to grow in the underlay. On the other hand, the smooth flow of an electric current will be blocked, and mobility will not be improved if a thickness difference is too great between a part in which the film thickness of the crystallinity control layer is great and a part in which the film thickness thereof is small in the channel of the organic TFT as described above. Therefore, if the maximum film thickness of the crystallinity control layer in the channel is set to be within a range from 0.3 to 30 nm, the crystallinity of the organic semiconductor layer is effectively improved. In this case, an island structure may be employed, and therefore the minimum value of the film thickness is set to be zero (0).

[3. Organic Semiconductor Layer]:

Specific limitations are not imposed on the organic semiconductor layer used in the present invention except that the organic semiconductor layer contains heterocyclic compounds or quinone compounds. In these compounds classified as a group, a conjugated system substantially reaches a hetero atom. As a result of our diligent research, it has been discovered that if an organic semiconductor contains hetero- cyclic compounds or quinone compounds, a crystallinity control layer can fulfill its function, so that mobility and preservation stability can be improved. It is possible to use an organic semiconductor containing heterocyclic or quinone compounds used in an organic TFT generally disclosed. Concrete examples of these organic compounds are shown below.

Preferably, examples of thiophene compounds to be used include thiophene oligomer that may contain substituents such as α-4T, α-5T, α-6T, α-7T, or α-8T derivatives, thiophene-based polymer such as polyhexylthiophene or poly(9,9-dioctylfluorenyl-2,7-diyl-co-bithiophene), bisbenzothiophene derivatives, α,α'-bis(dithieno[3,2-b:2',3'-d]thiophene), dithienothiophene-thiophene cooligomer, condensed oligothiophene, such as pentathienoacene, especially, a compound having a thienobenzene skeleton or a dithienobenzene skeleton, and dibenzothienobenzothiophene derivatives. More preferably, the organic semiconductor is made of compounds expressed by general formula (1) shown below.

[Chemical Compound 2]

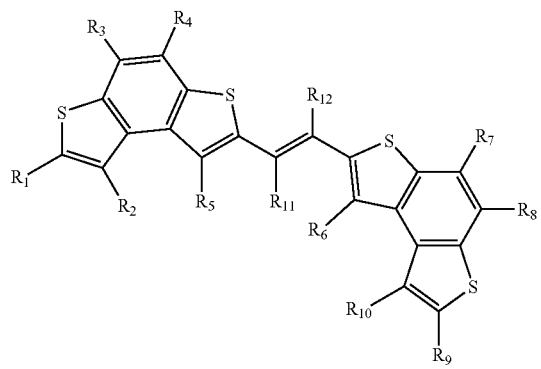

(1)

In the formula, R1 to R10 each independently denote hydrogen atom, halogen atom, cyano group, alkyl group whose carbon number is 1 to 30, haloalkyl group whose carbon number is 1 to 30, alkoxyl group whose carbon number is 1 to 30, haloalkoxyl group whose carbon number is 1 to 30, alkylamino group whose carbon number is 1 to 30, dialkylamino group whose carbon number is 2 to 60 (the alkyl group may be combined mutually, and may form a ring structure containing nitrogen atoms), alkylsulfonyl group whose carbon number is 1 to 30, haloalkylsulphonyl group whose carbon number is 1 to 30, alkylthio group whose carbon number is 1 to 30, haloalkylthio group whose carbon number is 1 to 30, alkylsilyl group whose carbon number is 3 to 30, aromatic hydrocarbon group whose carbon number is 6 to 60, or aromatic heterocyclic group whose carbon number is 1 to 60. Each of these groups may have substituents.

Although concrete examples of the compounds (1) mentioned above are expressed by the following general formulas (3) to (32), the present invention is not limited to these examples.

[Chemical Compound 3]
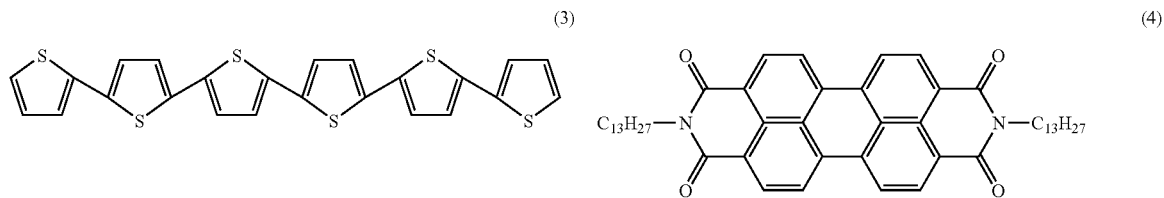
(3)
(4)
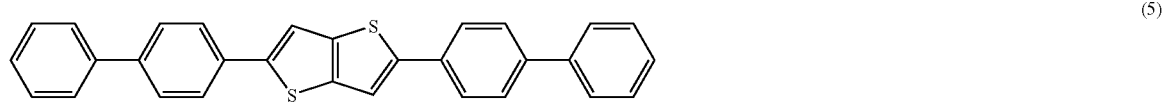
(5)
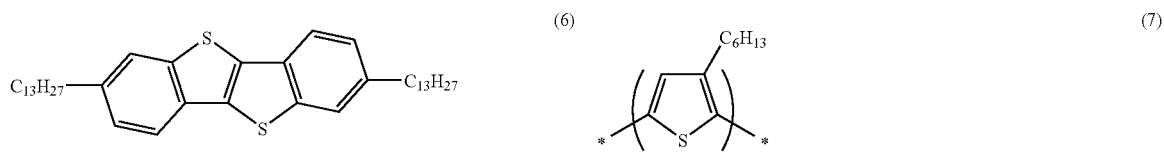
(6)
(7)
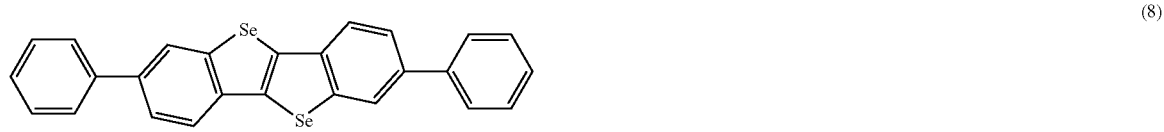
(8)
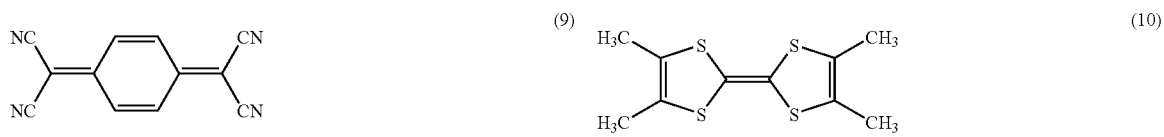
(9)
(10)
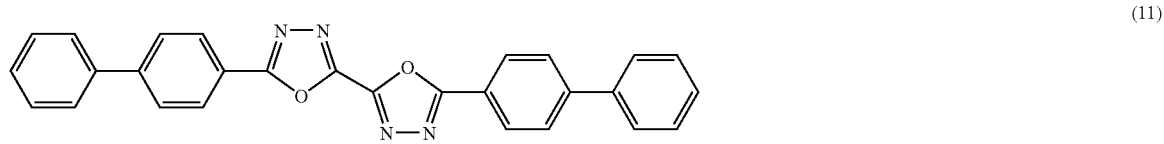
(11)
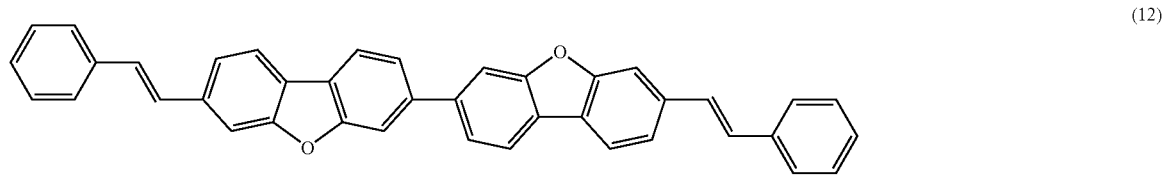
(12)
[Chemical Compound 4]
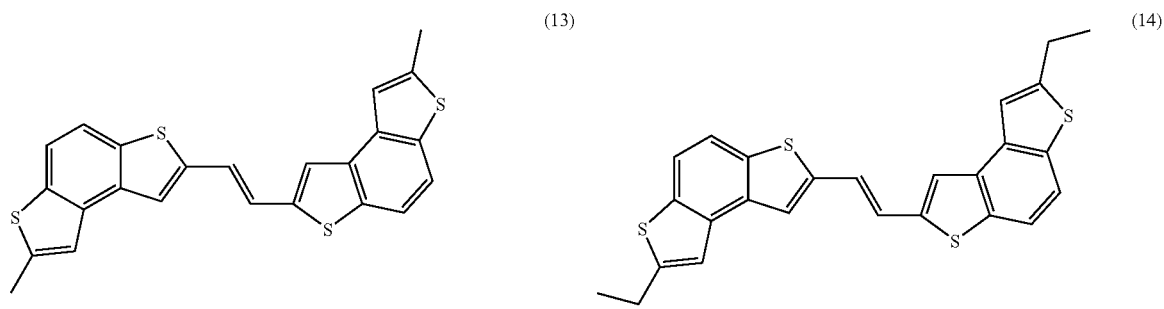
(13)
(14)

-continued
(15)
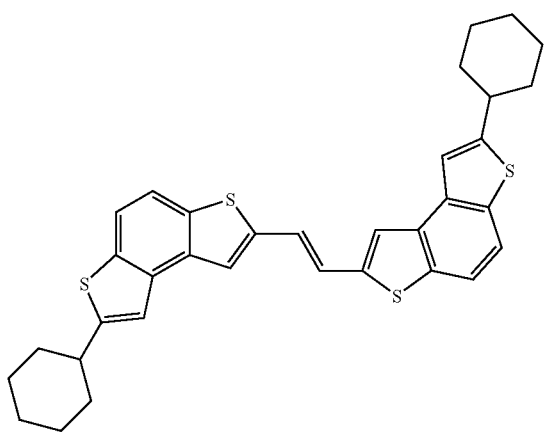
(16)
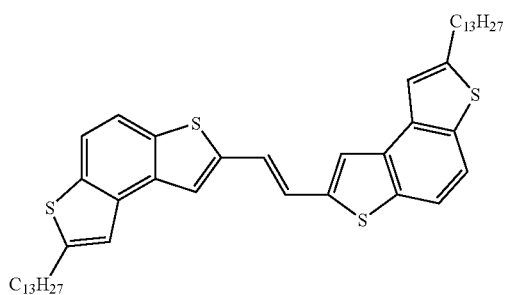
(17)
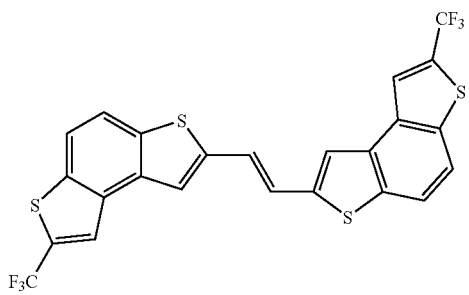
(18)
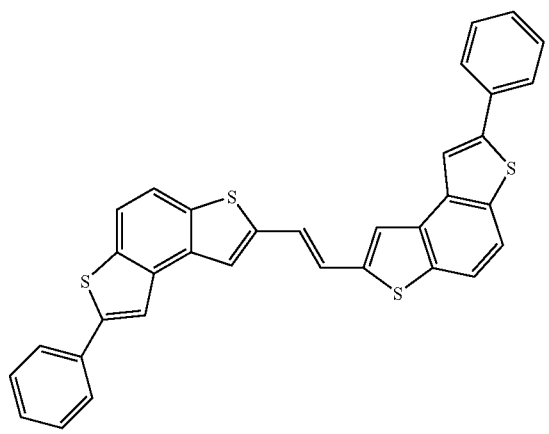
(19)
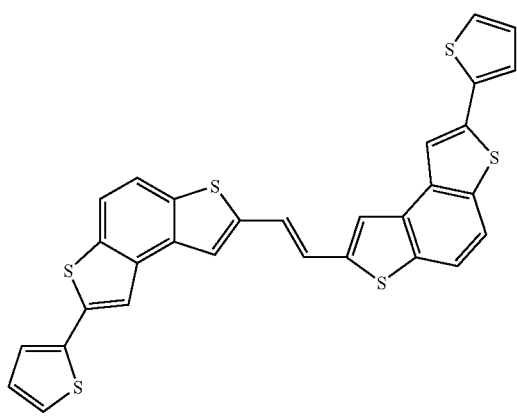
(20)
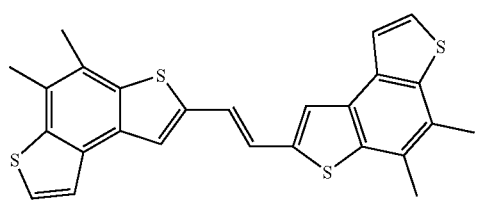
(21)
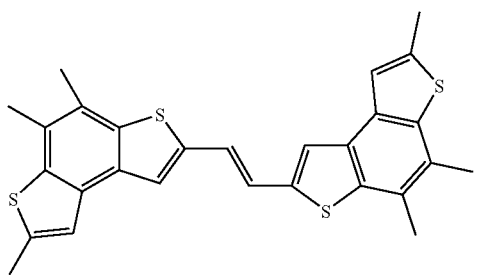
(22)
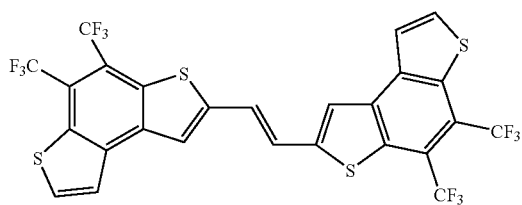

-continued
(23)
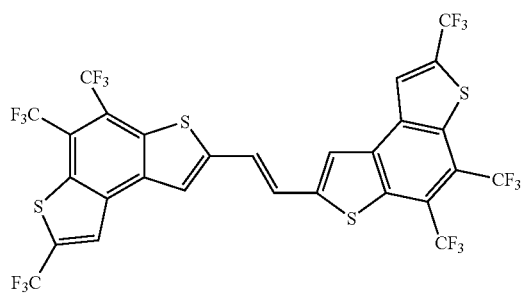
(24)
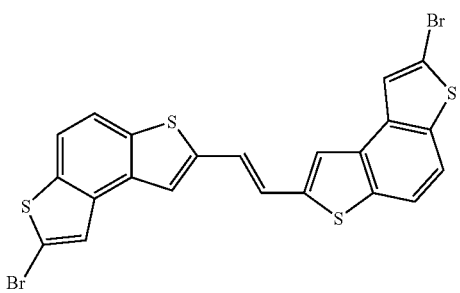
[Chemical Compound 5]
(25)
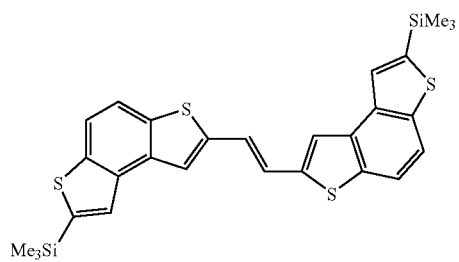
(26)
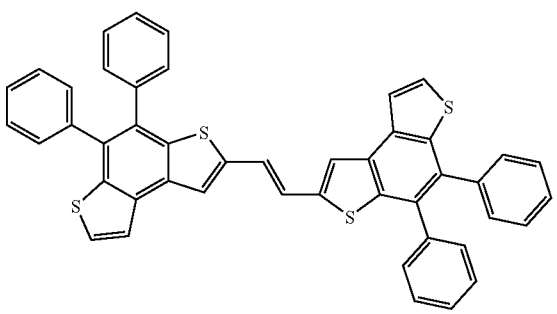
(27)
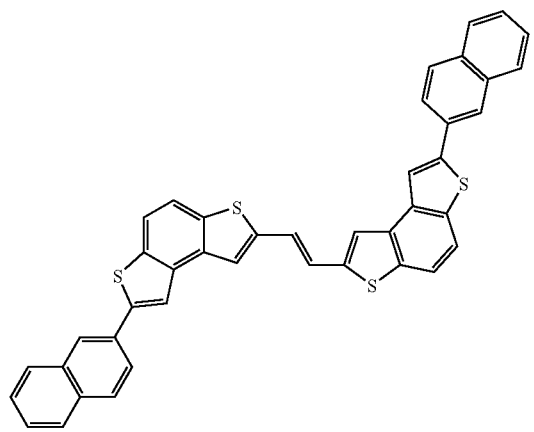
(28)
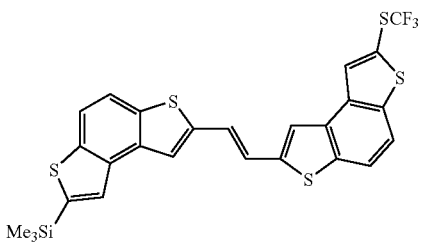
(29)
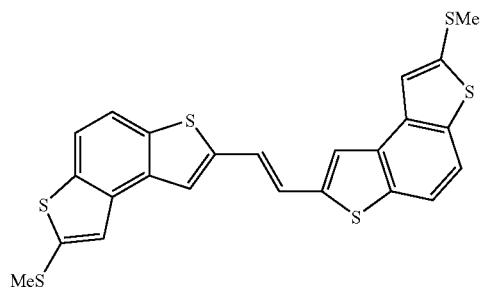
(30)
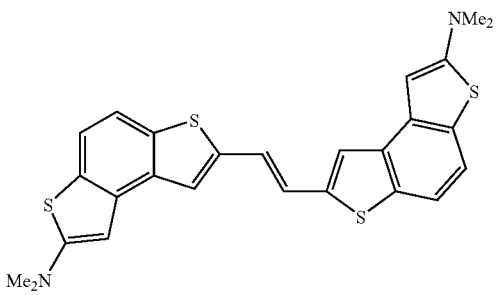

-continued

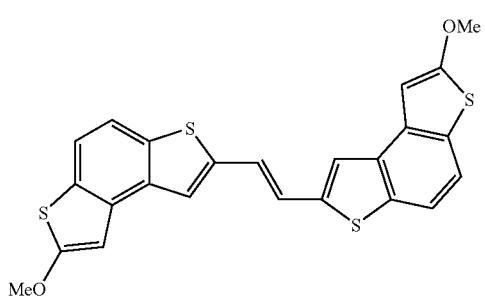

(31)

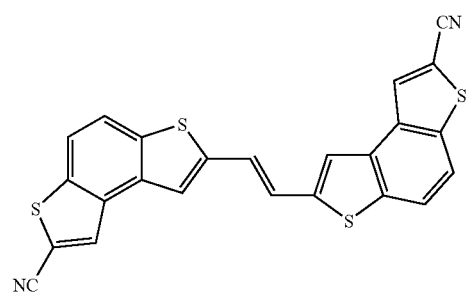

(32)

Alternatively, examples thereof include selenophene oligomer, metal-free phthalocyanine, copper phthalocyanine, fluorinated copper phthalocyanine, lead phthalocyanine, titanylphthalocyanine, porphyrins such as platinum porphyrin, porphyrin, and benzoporphyrin, tetracarboxylic acids such as N,N'-diphenyl-3,4,9,10-perylenetetracarboxylic acid diimide, N,N'-dioctyl-3,4,9,10-perylenetetracarboxylic acid diimide (C8-PTCDI), 1,4,5,8-naphthalenetetracarboxylic acid dianhydride (NTCDA), and 1,4,5,8-naphthalenetetracarboxylic diimide (NTCDI), tetrathiafulvalene (TTF), and its derivatives. Alternatively, those are compounds containing benzofuran, dibenzofuran, etc.

Examples of the above-mentioned quinones include quinoid oligomer such as tetracyanoquinodimethane (TCNQ) or 11,11,12,12-tetracyanonaphtho-2,6-quinodimethane (TCNNQ), and anthraquinone.

[4. Film Thickness and Film-Forming Method of Organic Semiconductor]:

Specific limitations are not imposed on the film thickness of the organic semiconductor layer in the organic TFT of the present invention, and usually the film thickness is 0.5 nm to 1 μm, and preferably 2 nm to 250 nm. Additionally, specific limitations are not imposed on the film-forming method of the organic semiconductor, and a well-known method can be applied thereto. An organic semiconductor layer is formed from the above-mentioned materials for the organic semiconductor layer, for example, by a printing/application method such as a molecular-beam evaporation method (MBE method), a vacuum evaporation method, a chemical vapor deposition method, dipping method of a solution in which materials are dissolved in a solvent, a spin coating method, a casting method, a bar coating method, or a roll coating method, or by a baking, electropolymerization, or from-solution self assembly means, or by combination of these means. The field-effect mobility is improved by improving the crystallinity of the organic semiconductor layer, and therefore it is preferable to keep the substrate temperature high during a film-forming process if a method of forming a film from a vapor phase (e.g., evaporation or sputtering) is employed. Preferably, the temperature is 50 to 250° C., and, more preferably, 70 to 150° C. Additionally, preferably, annealing is performed after completing the formation of a film regardless of the film-forming method, because a high-performance device can be obtained thereby. Preferably, the temperature for annealing is 50 to 200° C., and, more preferably 70 to 200° C. Preferably, the period of time for annealing is 10 minutes to 12 hours, and, more preferably 1 to 10 hours.

[5. Purity of Organic Compounds Used for the Crystallinity Control Layer and the Organic Semiconductor Layer]:

Additionally, an electronic device, such as a transistor, that is high in field-effect mobility and in on/off ratio can be obtained by using materials having high purity. Therefore, it is preferable to apply refinement onto raw materials according to, for example, column chromatography, recrystallization, distillation, or sublimation if necessary. Preferably, any one of these refining methods is repeatedly performed, or a combination of these refining methods is executed, thus making it possible to improve its purity. Additionally, it is preferable to repeatedly perform sublimation/refinement at least two times as a final step for refinement. Preferably, according to these methods, materials whose purity is 90% or more, which is measured by high performance liquid chromatograph (HPLC), are used, and, more preferably 95% or more, and, most preferably 99% or more. As a result, the field-effect mobility and on/off ratio of the organic TFT can be improved, and the intrinsic performance of these materials can be elicited.

[6. Preferred Combination of Crystallinity Control Layer and Organic Semiconductor Layer]:

The crystallinity control layer has an average film thickness of 0.01 to 10 nm, and, if the maximum value of the film thickness in a channel region between the source electrode and the drain electrode falls within a range of 0.3 to 30 nm, specific limitations are not imposed on a combination of materials, and mobility and stability performance can be improved. Particularly-preferred combinations are as follows. Preferably, materials that are close to each other in the value of surface energy are used for the crystallinity control layer and the organic semiconductor layer. If their materials are close to each other in the value of surface energy, the crystallinity control layer and the organic semiconductor layer have crystallization tendencies similar to each other, and therefore the crystallinity and the grain size of the organic semiconductor layer can be improved. Preferably, a difference in surface energy is within a range of 0 to 30 mN/m, and, more preferably 0 to 20 mN/m. If a difference in surface energy is great, a direction in which grains of the organic semiconductor layer grow will disproportionately lean in a vertical direction, and film continuity and channel smoothness will deteriorate, and, as a result, mobility stops being improved, and the crystallinity of the organic semiconductor becomes lower, so that molecules cannot be regularly arranged, and transistor performance cannot be fulfilled.

Although concrete examples of preferred combinations are shown below, the present invention is not limited to these examples.

A first preferred combination, which is also an especially preferred combination, is as follow. The crystallinity control layer is made of condensed ring compounds, and the organic semiconductor layer is a compound containing thiophene rings. The crystallinity control layer is made of any one selected from anthracene, tetracene, pentacene, and hexacene; and the organic semiconductor layer is made of compounds selected from α-4T, α-5T, α-6T, α-7T, and α-8T derivatives, compounds containing thienobenzene skeletons or dithienobenzene skeletons, and dibenzothienobenzothiophene derivatives. It is the most preferred combination that the crystallinity control layer is made of any one selected from anthracene, tetracene, pentacene, and hexacene, and the organic semiconductor layer is made of compounds of general formula (1) shown below.

[Chemical Compound 6]

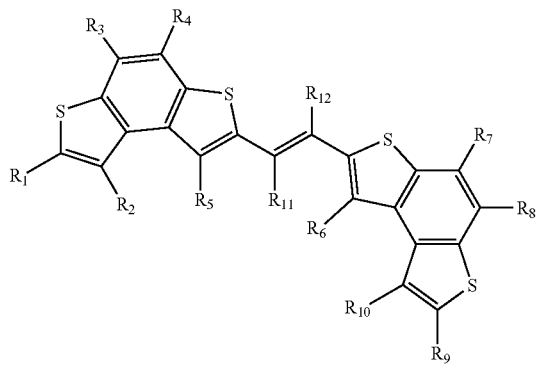

(1)

(In the formula, R1 to R10 each independently denote hydrogen atom, halogen atom, cyano group, alkyl group whose carbon number is 1 to 30, haloalkyl group whose carbon number is 1 to 30, alkoxyl group whose carbon number is 1 to 30, haloalkoxyl group whose carbon number is 1 to 30, alkylamino group whose carbon number is 1 to 30, dialkylamino group whose carbon number is 2 to 60 (alkyl groups may be connected together so as to form a ring structure having nitrogen atoms), alkylsulfonyl group whose carbon number is 1 to 30, haloalkylsulphonyl group whose carbon number is 1 to 30, alkylthio group whose carbon number is 1 to 30, haloalkylthio group whose carbon number is 1 to 30, alkylsilyl group whose carbon number is 3 to 30, aromatic hydrocarbon group whose carbon number is 6 to 60, and aromatic heterocyclic group whose carbon number is 1 to 60, and these groups may have substituents.)

Another preferred combination is as follows. The crystallinity control layer is made of hetero condensed ring compounds, and the organic semiconductor layer is made of any one selected from quinoid oligomer such as tetracyanoquinodimethane (TCNQ) or 11,11,12,12-tetracyanonaphtho-2,6-quinodimethane (TCNNQ), phthalocyanines, porphyrins, tetracarboxylic acids, tetrathiafulvalene (TTF), and its derivative. According to this combination, both the crystallinity control layer and the organic semiconductor layer have a polar group, and therefore surface energy tends to take a high value. Therefore, after all, a difference in surface energy therebetween can be set to be small.

Figure 7:
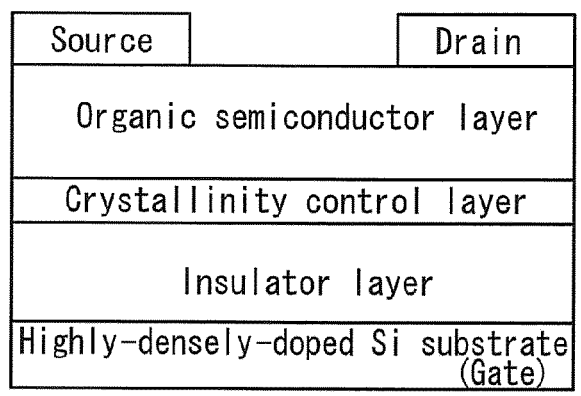
FIG. 7 is a view showing a device structure of an organic TFT according to Example 1 of the present invention.

[7. Substrate]:

The substrate in the organic TFT of the present invention serves to support the structure of the organic TFT. The substrate can use an inorganic compound such as metallic oxide or nitride, a plastic film (PET, PES, PC), a metallic plate, or a complex or layered plate of these materials, in addition to glass, as its material. Additionally, if the structure of the organic TFT can be satisfactorily supported by components other than the substrate, the organic TFT can be structured without the substrate. Additionally, in many cases, a silicon (Si) wafer is used as a material for the substrate. In these cases, silicon (Si) itself can be used as a substrate serving also as a gate electrode. Additionally, $SiO_2$, which is formed by oxidizing the surface of Si, can be utilized as an insulator layer. In this case, as shown in FIG. 7, a metallic layer, such as an Au-made layer, is sometimes formed on an Si-made substrate serving also as a gate electrode so as to serve as an electrode for connecting a lead wire.

[8. Electrode]:

No specific limitations are imposed on materials for the gate electrode, the source electrode, and the drain electrode in the organic TFT of the present invention as long as these materials are conductive materials. Examples of these materials include platinum, gold, silver, nickel, chrome, copper, iron, tin, antimony, lead, tantalum, indium, palladium, tellurium, rhenium, iridium, aluminum, ruthenium, germanium, molybdenum, tungsten, tin antimony oxide, indium tin oxide (ITO), fluorine-doped zinc oxide, zinc, carbon, graphite, glassy carbon, silver paste and carbon paste, lithium, beryllium, sodium, magnesium, kalium, calcium, scandium, titanium, manganese, zirconium, gallium, niobium, sodium-kalium alloy, magnesium/copper compound, magnesium/silver compound, magnesium/aluminum compound, magnesium/indium compound, aluminum/aluminum oxide compound, and lithium/aluminum compound.

Examples of methods for forming the above-mentioned electrodes include evaporation, electron-beam evaporation, sputtering, atmospheric-pressure plasma method, ion plating, chemical vapor deposition, electrodeposition, electroless plating, spin coating, printing, and ink-jetting. Additionally, examples of methods for performing patterning as necessary include a method of forming the electrodes according to photolithography or lift-off technique which are well-known while using electroconductive thin films formed by the above-mentioned methods and a method of forming a resist on a metallic foil, such as an aluminum foil or a copper foil, by thermal transfer or ink-jetting and then etching this. No limitations are imposed on the film thickness of an electrode formed in this way as long as an electric current is passed therethrough, and, preferably, the film thickness is within a range of 0.2 nm to 10 μm, and, more preferably 4 nm to 300 nm. If the film thickness falls within this preferred range, a case will never occur in which a thin film causes a rise in resistance and a drop in voltage. Additionally, the film is not too thick. Therefore much time is not consumed for film formation, and a laminated film can be smoothly formed without causing a level difference when another layer, such as a protective layer or an organic semiconductor layer, is placed thereon.

In the organic TFT of the present invention, it is preferable to use fluid electrode materials, such as solution, paste, ink, or dispersion liquid, containing the above-mentioned conductive materials, especially use electroconductive polymers or fluid electrode materials containing metal microparticles containing platinum, gold, silver, or copper for another source electrode, another drain electrode, and another gate electrode, which are different from those of the above-mentioned structure, and for a method for forming these electrodes. Preferably, to prevent damage to the organic semiconductor layer, solvents or dispersive mediums used in this case contain water of 60 wt % or more, preferably 90 wt % or more. For example, a well-known electroconductive paste may be used as a dispersive substance, and, preferably, this dispersive substance usually contains metal microparticles the particle, diameter of each of which is 0.5 nm to 50 nm or 1 nm to 10 nm. Examples of materials for such metal microparticles include platinum, gold, silver, nickel, chrome, copper, iron, tin, antimony, lead, tantalum, indium, palladium, tellurium, rhenium, iridium, aluminum, ruthenium, germanium, molybdenum, tungsten, and zinc. It is preferable to form electrodes by use of a dispersive substance produced by distributing those metal microparticles into a dispersive medium, which is water or an arbitrary organic solvent, by means of a dispersion stabilizer chiefly composed of organic materials. Examples of methods of producing a dispersive substance containing such metal microparticles include a physical production method, such as an in-gas evaporation method, a sputtering method, or a metal vapor synthesis method, and a chemical production method, such as a colloid method or a coprecipitation method, in which metal ions are deoxidized in a liquid phase so as to produce metal microparticles. It is preferable to employ the colloid method, which is disclosed by, for example, Japanese Unexamined Patent Publication No. H11-76800, Japanese Unexamined Patent Publication No. H11-80647, Japanese Unexamined Patent Publication No. H11-319538, and Japanese Unexamined Patent Publication No. 2000-239853, or the in-gas evaporation method, which is disclosed by, for example, Japanese Unexamined Patent Publication No. 2001-254185, Japanese Unexamined Patent Publication No. 2001-53028, Japanese Unexamined Patent Publication No. 2001-35255, Japanese Unexamined Patent Publication No. 2000-124157, and Japanese Unexamined Patent Publication No. 2000-123634.

The electrodes may be formed by directly performing patterning according to an inkjet method by use of a dispersive substance containing those metal microparticles, or may be formed from a coating film by lithography or laser ablation. Additionally, it is possible to employ a method of performing patterning according to a printing method, such as relief printing, intaglio printing, planographic printing, or screen printing. The electrodes are molded, thereafter the solvent is dried, and, as necessary, heating into a shape is performed at a temperature of 100° C. to 300° C., preferably 150° C. to 200° C., so that the metal microparticles are thermally bonded, thus making it possible to form an electrode pattern having a desired shape.

Additionally, it is preferable to use well-known electroconductive polymers having electrical conductivity improved by, for example, doping as materials for another gate electrode, another source electrode, and another drain electrode. For example, it is possible to suitably use electroconductive polyaniline, electroconductive polypyrrole, electroconductive polythiophene (e.g., a complex of polyethylenedioxythiophene (PEDOT) and polystyrene sulfonic acid (PSS)). These materials make it possible to reduce contact resistance between the organic semiconductor layer and both of the source electrode and the drain electrode. Likewise, to form these electrodes, patterning may be performed according to the inkjet method, and the electrodes may be formed from a coating film by lithography or laser ablation. Additionally, patterning can be performed according to a printing method, such as relief printing, intaglio printing, planographic printing, or screen printing.

In particular, materials having low electric resistance, especially, in a contact surface being in contact with the organic semiconductor layer that is one of the above-mentioned components are suitable as materials for forming the source electrode and the drain electrode. That is, this electric resistance corresponds to field-effect mobility indicated when an electric-current control device is manufactured, and, in order to obtain high mobility, resistance is required to be as small as possible. Generally, this depends on a magnitude relationship between the work function of materials for the electrodes and the energy level of the organic semiconductor layer.

Preferably, the following relational expressions are satisfied, in which a is the work function (W) of materials for the electrodes, b is the ionization potential (Ip) of the organic semiconductor layer, and c is the electron affinity (Af) of the organic semiconductor layer. Herein, a, b, and c are all positive values based on the vacuum level.

Preferably, in a p type organic TFT, the following expression (I) is satisfied:

$$b-a<1.5 \text{ eV} \tag{I}$$

and, more preferably, $$b-a<1.0 \text{ eV}.$$

If this is maintained in the relationship with the organic semiconductor layer, a high-performance device can be obtained. It is preferable to select as large a function as possible especially for the work function of materials for the electrodes. Preferably, the work function is 4.0 eV or more, and, more preferably 4.2 eV or more.

The value of the work function of metals can be selected from a list of effective metals having a work function of 4.0 eV or more, and the list appears in, for example, *Kagaku Binran Kiso-hen II* (Chemistry Manual Basic Edition II, page 493 (Revised third edition, edited by Chemical Society of Japan, issued by Maruzen Co., Ltd., 1983)). Such high work function metals are chiefly Ag (4.26, 4.52, 4.64, 4.74 eV), Al (4.06, 4.24, 4.41 eV), Au (5.1, 5.37, 5.47 eV), Be (4.98 eV), Bi (4.34 eV), Cd (4.08 eV), Co (5.0 eV), Cu (4.65 eV), Fe (4.5, 4.67, 4.81 eV), Ga (4.3 eV), Hg (4.4 eV), Ir (5.42, 5.76 eV), Mn (4.1 eV), Mo (4.53, 4.55, 4.95 eV), Nb (4.02, 4.36, 4.87 eV), Ni (5.04, 5.22, 5.35 eV), Os (5.93 eV), Pb (4.25 eV), Pt (5.64 eV), Pd (5.55 eV), Re (4.72 eV), Ru (4.71 eV), Sb (4.55, 4.7 eV), Sn (4.42 eV), Ta (4.0, 4.15, 4.8 eV), Ti (4.33 eV), V (4.3 eV), W (4.47, 4.63, 5.25 eV), and Zr (4.05 eV). Among these metals, preferred metals are noble metals (Ag, Au, Cu, Pt), and Ni, Co, Os, Fe, Ga, Ir, Mn, Mo, Pd, Re, Ru, V, and W. ITO, electroconductive polymers, such as polyaniline or PEDOT: PSS, and carbon are preferable excluding the metals. Specific limitations are not imposed on materials for the electrodes as long as the work function satisfies expression (I) mentioned above even if the materials contain one or more kinds of substances having a high work function that are the above-mentioned ones.

Preferably, in an n type organic TFT, the following expression (II) is satisfied:

$$a-c<1.5 \text{ eV} \tag{II}$$

and, more preferably, $$a-c<1.0 \text{ eV}.$$

The relation of expression (II) is established by using materials in which the organic semiconductor layer has an electron affinity of 4.2 eV even when, for example, Au whose work function is large (5.1, 5.37, 5.47 eV) is used as a metal.

If this is maintained in the relationship with the organic semiconductor layer, a high-performance device can be obtained. It is preferable to select as small a function as possible especially for the work function of materials for the electrodes. Preferably, the work function is 4.3 eV or less, and, more preferably 3.7 eV or less.

It is recommended to select concrete examples of metals having a low work function from a list of effective metals having a work function of 4.3 eV or less, and the list appears in, for example, *Kagaku Binran Kiso-hen II* (Chemistry Manual Basic Edition II, page 493 (Revised third edition, edited by Chemical Society of Japan, issued by Maruzen Co., Ltd., 1983)). Examples of such metals having a low work function include Ag (4.26 eV), Al (4.06, 4.28 eV), Ba (2.52 eV), Ca (2.9 eV), Ce (2.9 eV), Cs (1.95 eV), Er (2.97 eV), Eu (2.5 eV), Gd (3.1 eV), Hf (3.9 eV), In (4.09 eV), K (2.28 eV), La (3.5 eV), Li (2.93 eV), Mg (3.66 eV), Na (2.36 eV), Nd (3.2 eV), Rb (4.25 eV), Sc (3.5 eV), Sm (2.7 eV), Ta (4.0, 4.15 eV), Y (3.1 eV), Yb (2.6 eV), and Zn (3.63 eV). Among these metals, preferred metals are Ba, Ca, Cs, Er, Eu, Gd, Hf, K, La, Li, Mg, Na, Nd, Rb, Y, Yb, and Zn. Specific limitations are not imposed on materials for the electrodes as long as the work function satisfies expression (II) mentioned above even if the materials contain one or more kinds of substances having a low work function that are the above-mentioned ones. However, low-work-function metals easily deteriorate when these metals come into contact with moisture or oxygen in the atmosphere, and therefore it is preferable to, as necessary, coat these low-work-function metals with metals, such as Ag or Au, that are stable in the air. The film thickness necessary for coating is 10 nm or more, and films can be more adequately protected from oxygen and water in proportion to an increase in film thickness. However, in practical use, it is preferable to set the film thickness to be 1 μm or less from the viewpoint of, for example, productivity enhancement.

Additionally, in the organic thin film transistor according to this embodiment, a buffer layer may be disposed between the organic semiconductor layer and both of the source electrode and the drain electrode, for example, in order to improve injection efficiency. Preferably, with respect to the n type organic thin film transistor, this buffer layer is made of alkaline metals, such as LiF, $Li_2O$, CsF, Na2Co3, KCl, $MgF_2$, or $CaCO_3$ used for a cathode of an organic EL, or compounds having alkaline earth metal ionic bonds. Additionally, a compound, such as Alq, that is used as an electron-injection layer or as an electron-transport layer in the organic EL may be inserted as the buffer layer.

Preferably, a buffer layer with respect to a p type organic thin film transistor is made of a cyano compound such as $FeCl_3$, TCNQ, $F_4$-TCNQ, or HAT, CFx, an alkaline metal such as $GeO_2$, $SiO_2$, $MoO_3$, $V_2O_5$, $VO_2$, $V_2O_3$, MnO, $Mn_3O_4$, $ZrO_2$, $WO_3$, $TiO_2$, $In_2O_3$, ZnO, NiO, $HfO_2$, $Ta_2O_5$, $ReO_3$, and $PbO_2$, a metallic oxide other than alkaline earth metals, or an inorganic compound such as ZnS or ZnSe. In many cases, these oxides cause oxygen loss, and hence become suitable for hole injection. Additionally, this buffer layer may be made of an amine-based compound, such as TPD or NPD, or a compound, such as CuPc, that is used as a hole-injection layer or as a hole-transport layer in the organic EL device. Additionally, preferably, the buffer layer is made of two or more of the above-mentioned compounds different in kind from each other.

It is generally known that the buffer layer has the effect of lowering a threshold voltage by the lowering of the injection barrier of carriers and the effect of driving the transistor at a low voltage. With respect to the compounds of the present invention, we have discovered that the buffer layer has not only the low-voltage effect but also the effect of improving mobility. The reason is that carrier traps exists at an interface between the organic semiconductor layer and the insulator layer, and, when carrier injection is caused by application of a gate voltage, a carrier that has been first injected is used to bury the traps, and the traps is buried at a low voltage by inserting a buffer layer, and, as a result, mobility is improved. The buffer layer is merely required to thinly lie between the electrodes and the organic semiconductor layer, and its thickness is 0.1 nm to 30 nm, and, preferably 0.3 nm to 20 nm.

[9. Insulator Layer]:

No specific limitations are imposed on materials used for an insulator layer in the organic TFT of the present invention as long as these materials have electric insulating properties and can be formed as thin films. It is possible to use materials, such as metallic oxides (which include oxides of silicon), metallic nitrides (which include nitrides of silicon), polymers, or organic low molecules, whose electrical resistivity is 10 Ωcm or more at room temperature. Especially, an inorganic oxide film having a high relative dielectric constant is preferable. Examples of inorganic oxides used for this film include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, lanthanum oxide, fluorine oxide, magnesium oxide, bismuth oxide, bismuth titanate, niobium oxide, strontium bismuth titanate, strontium bismuth tantalate, tantalum pentoxide, bismuth tantalate niobate, trioxide yttrium, and combinations of these compounds. Especially, silicon oxide, aluminum oxide, tantalum oxide, and titanium oxide are preferable. Additionally, inorganic nitrides, such as silicon nitride ($Si_3N_4$, SixNy (x, y>0)) or aluminum nitride, can be suitably used.

The insulator layer may be made of a precursor containing a metal alkoxide. In this case, for example, the substrate is covered with a solution of the precursor, and is subjected to a chemical solution process including heat treatment, and, as a result, an insulator layer is formed. Metals forming the metal alkoxide are selected from transition metals lanthanoids or main group elements. Concrete examples of such metals include barium (Ba), strontium (Sr), titanium (Ti), bismuth (Bi), tantalum (Ta), zircon (Zr), iron (Fe), nickel (Ni), manganese (Mn), lead (Pb), lanthanum (La), lithium (Li), sodium (Na), kalium (K), rubidium (Rb), cesium (Cs), francium (Fr), beryllium (Be), magnesium (Mg), calcium (Ca), niobium (Nb), thallium (Tl), mercury (Hg), copper (Cu), cobalt (Co), rhodium (Rh), scandium (Sc), and yttrium (Y). Examples of alkoxides forming the metal alkoxide include derivatives from alcohols including methanol, ethanol, propanol, isopropanol, butanol, isobutanol, etc., and derivatives from alkoxy alcohols including methoxyethanol, ethoxyethanol, propoxyethanol, butoxyethanol, pentoxyethanol, heptoxyethanol, methoxypropanol, ethoxypropanol, propoxypropanol, butoxypropanol, pentoxypropanol, and heptoxypropanol.

In the present invention, if the insulator layer is made of the above-mentioned materials, polarizations can easily occur in the insulator layer, and the threshold voltage of transistor operation can be made low. If the insulator layer is made of silicon nitride, especially, made of $Si_3N_4$, SixNy, or SiONx (x, y>0) among the above-mentioned materials, polarizations can more easily occur therein, and the threshold voltage of transistor operation can be made lower.

Examples of materials for the insulator layer using organic compounds include polyimide, polyamide, polyester, polyacrylate, photo-curable resin of photo radical polymerization system or photo cationic polymerization system, copolymer containing acrylonitrile elements, polyvinylphenol, polyvinylalcohol, novolac resin, and cyanoethylpullulan. Other examples thereof include wax, polyethylene, polychloropyrene, polyethyleneterephthalate, polyoxymethylene, polyvinylchloride, polyvinylidene fluoride, polymethylmethacrylate, Poly Sulfone, polycarbonate, polyimidecyanoethylpullulan, poly(vinylphenol) (PVP), polystyrene (PS), polyolefine, polyacrylamide, poly(acrylic acid), novolac resin, resol resin, polyimide, polyxylylene, epoxy resin, and, in addition, polymeric materials having a high dielectric constant such as pullulan.

A particularly-suited material for the insulator layer is an organic compound having water repellency. The use of an organic compound having such water repellency makes it possible to control interaction between the insulator layer and the organic semiconductor layer, and makes it possible to enhance the crystallinity of the organic semiconductor layer while using cohesive properties originally possessed by the organic semiconductor, and therefore makes it possible to improve device performance. A polyparaxylylene derivative described in Yasuda et al., Jpn. J. Appl. Phys. Vol. 42 (2003) pp. 6614-6618 or a compound described in Janos Veres et al., Chem. Mater., Vol. 16 (2004) pp. 4543-4555 can be mentioned as an example of the organic compound.

Figure 4:
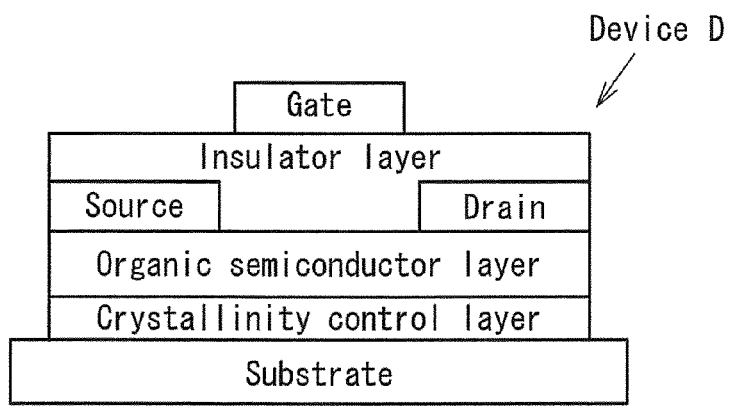
FIG. 4 is a view showing a device structure of an organic TFT according to still another embodiment of the present invention.

When the top gate structure shown in FIG. 1 and FIG. 4 is employed, the use of the above-mentioned organic compound as a material for the insulator layer makes it possible to form a film while lessening damage to the organic semiconductor layer, and therefore serves as an effective method.

The insulator layer may be a mixed layer in which the above-mentioned inorganic or organic compound materials are used not in the form of a single material but in the form of a plurality of materials, and may be a laminated structure composed of these materials. In this case, device performance can also be controlled by mixing or piling a material having a high dielectric constant and a material having water repellency together as necessary.

Additionally, the insulator layer may be formed of an anodic oxide film, or this anodic oxide film may be used as a part of the structure of the insulator layer. Preferably, the anodic oxide film is subjected to a sealing process. The anodic oxide film is formed by anodizing a metal, which can be anodized, according to a well-known method. Aluminum or tantalum can be mentioned as a to-be-anodized metal. No specific limitations are imposed on the anodizing method, and a well-known method can be employed. An oxide film is formed by performing an anodizing process. Any type of solution can be used as an electrolytic solution used for an anodizing process as long as a porous oxide film can be formed thereby. In general, use is made of sulfuric acid, phosphoric acid, oxalic acid, chromic acid, boric acid, sulfamic acid, benzenesulfonic acid, or a mixed acid produced by combining two or more kinds of acids of the above-mentioned acids together, or salts of the above-mentioned acids. Anodizing process conditions cannot be absolutely specified because they variously change while depending on an electrolytic solution to be used. In general, appropriate conditions are an electrolyte concentration of 1 to 80 wt %, an electrolyte temperature of 5 to 70° C., an electric current density of 0.5 to 60 A/cm$^2$, a voltage of 1 to 100 volts, and an electrolytic time of 10 seconds to 5 minutes. A preferred anodizing process is to use a sulfuric-acid, phosphoric-acid, or boric-acid aqueous solution as the electrolytic solution and to perform the process by use of a direct current. An alternating current can be used instead of a direct current. Preferably, the acid concentration is 5 to 45 wt %, and the electrolytic process is performed for 20 to 250 seconds under the conditions of an electrolyte temperature of 20 to 50° C. and an electric current density of 0.5 to 20 A/cm$^2$.

If the thickness of the insulator layer is small, the effective voltage to be applied to the organic semiconductor layer will be raised, and therefore the drive voltage and threshold voltage of the device itself can be lowered. However, on the contrary, a leakage current between the source electrode and the gate electrode becomes large, and therefore an appropriate film thickness is required to be selected. In other words, the thickness of the insulator layer is usually 10 nm to 5 µm, and, preferably 50 nm to 2 µm, and, more preferably 100 nm to 1 µm.

Additionally, an arbitrary orientation process may be applied between the insulator layer and the organic semiconductor layer. A preferred example thereof is a method of applying a water-repellent process or a similar process to the surface of the insulator layer, then reducing the interaction between the insulator layer and the organic semiconductor layer, and improving the crystallinity of the organic semiconductor layer. More specifically, that is a method of forming a self-assembled film by bringing a silane coupling agent, e.g., a material for a self-assembled oriented film, such as hexamethyldisilazane, octadecyltrichlorosilane, trichloromethylsilazane, alkanephosphate, alkanesulfonate, or alkanecarboxylate, into contact with the surface of the insulating film in a liquid phase state or a vapor phase state, and thereafter moderately applying a dry process thereunto. Another method is also suitable that is carried out such that a film made of, for example, polyimide is formed on the surface of the insulating film as in the orientation of liquid crystals, and the surface of the film is subjected to a rubbing process.

Examples of methods employed for forming the insulator layer include dry processes, e.g., vacuum evaporation method, molecular beam epitaxial growth method, ion cluster beam method, low energy ion beam method, ion plating method, CVD method, sputtering method, and atmospheric-pressure plasma method disclosed by Japanese Unexamined Patent Publication No. H11-61406, Japanese Unexamined Patent Publication No. H11-133205, Japanese Unexamined Patent Publication No. 2000-121804, Japanese Unexamined Patent Publication No. 2000-147209, and Japanese Unexamined Patent Publication No. 2000-185362, and wet processes, e.g., an application method, such as spray coating method, spin coating method, blade coating method, dip coating method, cast method, roll coating method, bar coating method, or die coating method, and a patterning method, such as printing or ink-jetting. Each insulator-layer forming method can be employed in accordance with materials. For example, in the wet process, use is made of a method of applying and drying a liquid obtained by distributing microparticles of an inorganic oxide into arbitrary organic solvent or water by use of a dispersion assisting agent, such as a surface active agent, as necessary, or is made of a so-called sol-gel method of applying and drying an oxide precursor, such as an alkoxide solution.

[10. Overall Formation Process for Organic TFT]:

No specific limitations are imposed on a method of forming the organic TFT of the present invention, and a well-known method can be employed. Preferably, a series of device forming steps consisting of substrate mounting, gate electrode formation, insulator layer formation, crystallinity control layer formation, organic semiconductor layer formation, source electrode formation, and drain electrode formation are carried out completely without coming into contact with the atmosphere according to a desired device structure, because device performance can be prevented from being impaired by moisture or oxygen in the atmosphere as a result of contact with the atmosphere. Preferably, even when the device must be formed by being unavoidably brought into contact with the atmosphere once, steps subsequent to the step of organic semiconductor layer formation are performed completely without contact with the atmosphere, and, immediately before the step of organic semiconductor layer formation, a surface on which the organic semiconductor layer is placed (for example, in device B (see FIG. 2), a surface in which the source electrode and the drain electrode are partially placed on the insulator layer) is purified and activated by, for example, ultraviolet-light irradiation, ultraviolet-light/ozone irradiation, oxygen plasma, or argon plasma, and then the organic semiconductor layer is placed thereon. Some of the p type organic semiconductors can improve its performance by being brought into contact with the atmosphere once so as to absorb oxygen and other gases, and therefore appropriate contact with the atmosphere is permissible depending on materials to be used.

Additionally, a gas barrier layer may be formed on the whole or part of the outer peripheral surface of the organic transistor device, for example, in consideration of an influence on the organic semiconductor layer exerted by oxygen or water contained in the atmosphere. Materials regularly employed in this field can be used for forming the gas barrier layer. Examples of such materials include polyvinylalcohol, ethylene-vinyl alcohol copolymer, polyvinyl chloride, polyvinylidene chloride, and polychlorotrifluoroethylene. Additionally, inorganic substances having insulation properties illustrated in the above-mentioned insulator layer can be used.

[11. Light-Emitting Transistor]:

The organic TFT of the present invention can be used as a light-emitting device by use of an electric charge injected from the source electrode or from the drain electrode. In other words, the organic TFT of the present invention can be used as an organic-thin-film light-emitting transistor concurrently having the function of a light-emitting device (organic EL). In other words, light emission intensity can be controlled by allowing an electric current flowing between the source and drain electrodes to be controlled by the gate electrode. Accordingly, the light-emitting device and the transistor to control light emission can be integrated, and therefore costs can be reduced by heightening the aperture ratio of a display and by simplifying the manufacturing process, and a practically great advantage can be brought about. The content given in the item of "detailed description" having the crystallinity control layer is descriptively sufficient when the device is used as organic thin film transistor. Preferably, to operate the organic TFT of the present invention as an organic light-emitting transistor, a hole is required to be injected, from either the source electrode or the drain electrode whereas an electron is required to be injected from the remaining electrode, and the following conditions are satisfied to improve light-emission performance.

[Source Electrode and Drain Electrode as Light-Emitting Transistor];

Preferably, to improve hole injection, the organic thin film light-emitting transistor of the present invention has at least one electrode serving as a hole-injecting electrode. The "hole-injecting electrode" denotes an electrode containing a material whose work function is 4.2 eV or more as mentioned above. Additionally, preferably, to improve electron injection, at least the remaining electrode is provided to serve as an electron-injecting electrode. The "electron-injecting electrode" denotes an electrode containing a material whose work function 4.3 eV or less as mentioned above. More preferably, the device is an organic thin film light-emitting transistor including one electrode serving as a hole-injecting electrode and the other electrode serving as an electron-injecting electrode.

[Device Structure as Light-Emitting Transistor];

Preferably, in the organic thin film light-emitting transistor of the present invention, a hole-injection layer is inserted between at least one electrode and the organic semiconductor layer in order to improve hole injection. For example, an amine-based material, which is used as a material for hole injection or as a material for hole transport in the organic EL device, can be mentioned as a material for the hole-injection layer. Preferably, to improve electron injection, the electron injection layer is inserted between at least one electrode and the organic semiconductor layer. Like the hole, the electron-injection layer can be made of, for example, a material for electronic injection that is used for the organic EL device. More preferably, the device is an organic thin film light-emitting transistor including a hole-injection layer under one electrode, the other electrode that is an electron-injecting electrode, and an electrode in which the work function of the hole-injecting electrode is larger than the work function of the electron-injecting electrode.

[Especially-Preferred Organic Semiconductor as Light-Emitting Transistor];

The most preferred organic semiconductor used in the organic thin film light-emitting transistor of the present invention is made of compounds shown below.

As already described, the mobility tends to be particularly enhanced in compounds expressed by general formula (1) shown below. Additionally, the compounds of general formula (1) can emit light, and therefore light is highly effectively emitted by acquisition of a high mobility in the present invention.

[Chemical Compound 7]

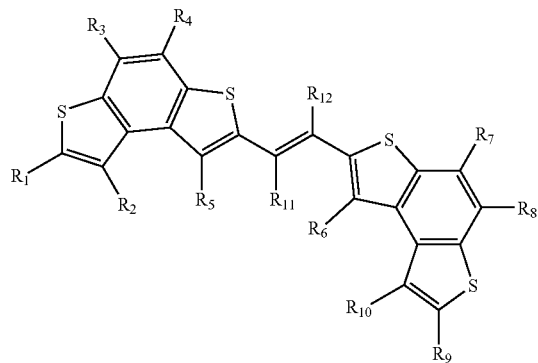

(1)

(In the formula, R1 to R10 each independently denote hydrogen atom, halogen atom, cyano group, alkyl group whose carbon number is 1 to 30, haloalkyl group whose carbon number is 1 to 30, alkoxyl group whose carbon number is 1 to 30, haloalkoxyl group whose carbon number is 1 to 30, alkylamino group whose carbon number is 1 to 30, dialkylamino group whose carbon number is 2 to 60 (alkyl groups may be connected together so as to form a ring structure having nitrogen atoms), alkylsulfonyl group whose carbon number is 1 to 30, haloalkylsulphonyl group whose carbon number is 1 to 30, alkylthio group whose carbon number is 1 to 30, haloalkylthio group whose carbon number is 1 to 30, alkylsilyl group whose carbon number is 3 to 30, aromatic hydrocarbon group whose carbon number is 6 to 60, and aromatic heterocyclic group whose carbon number is 1 to 60, and these groups may have substituents.)

EXAMPLES

Next, the present invention will be described in detail with reference to examples.

[Synthesis of Compound (1)];

The synthetic process of compound (1) is shown below.

[Chemical Compound 8]

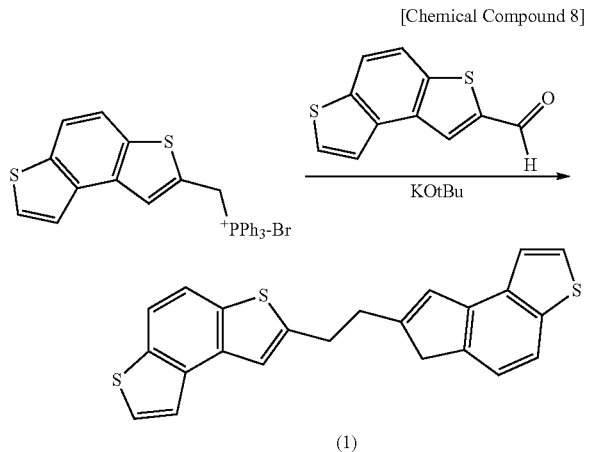

(1)

3.00 grams (13.7 mmol) of benzo[1,2-b:4,3-b']dithiophenyl-2-carboxaldehyde and 7.50 grams (13.7 mmol) of {benzo[1,2-b:4,3-b']dithiophenyl-2-yl-methyl}triphenylphosphonium bromide were contained in a 300-milliliter three-necked flask, and then the inside of the flask was substituted with argon gas. A mixed solution of 50 ml of tetrahydrofuran and 200 ml of ethanol was added to this flask, and then a 40-milliliter ethanol solution of 2.30 g (20.6 mmol) of potassium tertiary butoxide was added at room temperature, and was stirred for 16 hours. Water and a 10% hydrochloric acid (10 ml) were added to a reactant, and solid substances obtained by filtration were washed by ethanol and hexane, and, as a result, a rough product was obtained. Furthermore, sublimation and refinement were carried out, and, as a result, 5.38 g (13.3 mmol, yield 97%) of refined product was obtained. From measurement results of $^1$H-NMR (90 MHz) and FD-MS, it was confirmed that this refined product is a desired compound (1).

Example 1

[Manufacture of Organic TFT];

Organic TFTs were manufactured through the following steps. First, a semifinished product was prepared that has an insulator layer of a 300-nm thermal oxidation film formed on an Si substrate by oxidizing the surface of the Si substrate (used also as an n-type 0.02-Ωcm resistivity gate electrode) according to a thermal oxidation method. This substrate was subjected to ultrasonic cleansing for about five minutes by use of acetone, was then exposed to HMDS steam for 24 hours, and was brought into a hydrophobic state. Thereafter, the substrate was mounted on a vacuum evaporation apparatus (made by EIKO ENGINEERING, Ltd., EO-5), and was evacuated to $1.2 \times 10^{-4}$ Pa, and, as a result, pentacene was formed on the insulator layer as a 1.6-nanometer crystallinity control layer. Thereafter, a thin film made of compound (1) and having a film thickness of 30 nm was vapor-deposited as an organic semiconductor layer. The substrate temperature indicated at this time was a room temperature, and the vapor-deposition rate of pentacene was 0.0087 nm/s, and the vapor-deposition rate of compound (1) was 0.018 nm/s. The sample was taken out of the vacuum evaporation apparatus used for organic thin films, was then contained in a vacuum evaporation apparatus used for metallic thin films via the atmosphere, and was evacuated to a degree of vacuum of $2.2 \times 10^{-3}$ Pa. Thereafter, a gold thin film having a thickness of 50 nm was vapor-deposited at a vapor deposition rate of 0.24 nm/s through a metal mask having an electrode pattern whose channel length is 20 μm and whose channel width is 2 mm. The thus vapor-deposited gold thin film is a source electrode and a drain electrode. FIG. 7 shows a cross-section of the structure of an organic TFT produced in this example.

A gate voltage of 0 to −100 V was applied to the gate electrode of the organic TFT obtained in this way. A voltage of 0 to −100 V was applied between the source and drain electrodes, so that an electric current was allowed to flow therebetween. In this example, holes are generated in a channel region (i.e., source-to-drain area) of the organic semiconductor layer, and this organic TFT operates as a p-type transistor. Field-effect mobility μ of the hole was calculated from Equation (III) shown below, and was 1.2 cm$^2$/Vs.

$$I_D = (W/2L) \cdot C \mu \cdot (V_G - V_T)^2 \quad \text{(III)}$$

In Equation (III), $I_D$ is a source-to-drain electric current, W is a channel width, L is a channel length, C is an electric capacity per unit area of the gate insulator layer, $V_T$ is a gate threshold voltage, and $V_G$ is a gate voltage.

Figure 8:
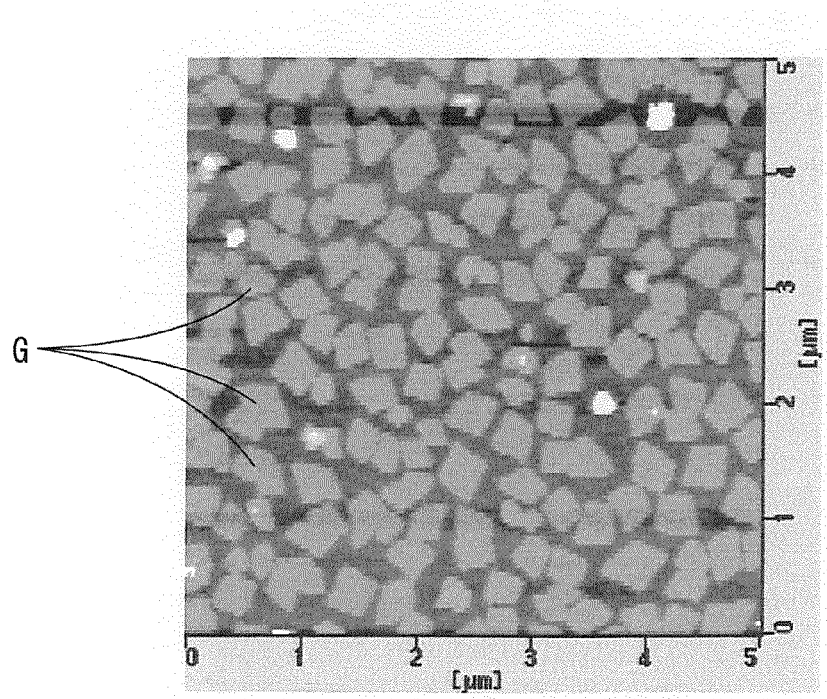
FIG. 8 is a view showing a crystalline state of a crystallinity control layer of the organic TFT according to Example 1 of the present invention.

Additionally, this organic TFT was kept in the atmosphere for nine days, and, as a result, the mobility was still kept at a high value of 0.34 cm$^2$/Vs. At this time, the surface energy of pentacene was 45 mN/m, and the surface energy of compound (1) was 37 mN/m. When the crystallinity control layer was formed, the substrate was taken out, and the layer was observed by an atomic force microscope (AFM), and, as a result, grains G, G, G, . . . were proved to have grown like islands as shown in FIG. 8. Transistor characteristics of the organic TFT device produced as above are shown in Table 1.

Example 2

[Manufacture of Organic TFT];

The device was produced by the same experiments and operations as in Example 1 except that anthracene was used instead of pentacene as a crystallinity control layer in Example 1 and that α-6T was used instead of compound (1) as an organic semiconductor layer. Transistor characteristics of the organic TFT device produced here are shown in Table 1. At this time, the surface energy of anthracene was 40 mN/m, and the surface energy of α-6T was 32 mN/m.

[Chemical Compound 9]

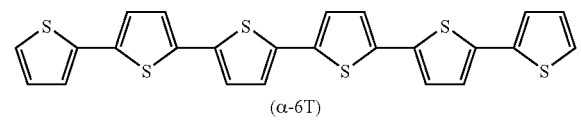

(α-6T)

Example 3

[Manufacture of Organic TFT];

The device was produced in the same way as in Example 1 except that copper phthalocyanine was used instead of pentacene as a crystallinity control layer in Example 1 and that PTCDI-C13 was used instead of compound (1) as an organic semiconductor layer. The organic semiconductor of this organic TFT device is used as an n type. A gate voltage of 0 to 100 V was applied to the gate electrode of the organic TFT obtained here, and a voltage of 0 to 100 V was applied to between the source and the drain electrodes, so that an electric current was allowed to flow there. Transistor characteristics of the organic TFT device produced here are shown in Table 1. At this time, the surface energy of copper phthalocyanine was 34 mN/m, and the surface energy of PTCDI-C13 was 47 mN/m.

[Chemical Compound 10]

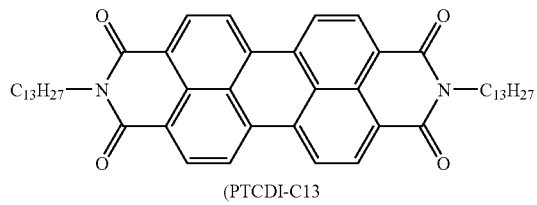

(4)

(PTCDI-C13)

Comparative Example 1

[Manufacture of Organic TFT];

The organic TFT was produced in the same way as in Example 1 except that the crystallinity control layer was not used, and, as shown in Table 1, transistor characteristics were not exhibited.

Comparative Example 2

[Manufacture of Organic TFT];

The organic TFT was produced in the same way as in Example 1 except that the crystallinity control layer was not used and that the organic semiconductor layer was made of pentacene instead of compound (1). Results of Comparative Example 2 are shown in Table 1.

Comparative Example 3

[Manufacture of Organic TFT];

The organic TFT was produced in the same way as in Example 1 except that the film thickness of pentacene serving as a crystallinity control layer was 30 nm. Results of Comparative Example 3 are shown in Table 1.

From Table 1, it became clear that the device provided with the crystallinity control layer is improved in mobility and in preservation stability in the atmosphere. Additionally, as is clear from comparison with Comparative Example 2, it became clear that an electric current does not flow through pentacene in the device of Example 1, and flows through the layer of compound (1) as a channel.

Example 4

[Manufacture of Organic Thin Film Light-Emitting Transistor];

Organic TFTs were produced through the following steps. These production steps are shown in FIG. 9(a) to FIG. 9(d). First, a semifinished product was prepared that has an insulator layer 14 of a 300-nm thermal oxidation film formed on an Si substrate 13 by oxidizing the surface of the Si substrate 13 (used also as an n-type 0.02-Ωcm resistivity gate electrode) according to a thermal oxidation method. This substrate 13 was subjected to ultrasonic cleansing for about five minutes by use of acetone, was then exposed to HMDS steam for 24 hours, and was brought into a hydrophobic state. Thereafter, the substrate 13 was mounted on a vacuum evaporation apparatus (made by EIKO ENGINEERING, Ltd., EO-5), and was evacuated to $1.2 \times 10^{-4}$ Pa, and, as a result, pentacene was formed on the insulator layer 14 as a crystallinity control layer 15 (film thickness of 1.6 nm). Thereafter, a thin film (having a film thickness of 30 nm) made of compound (1) was vapor-deposited as an organic semiconductor layer 16. The substrate temperature indicated at this time was a room temperature, and the vapor-deposition rate of pentacene was 0.0087 nm/s, and the vapor-deposition rate of compound (1) was 0.018 nm/s. The sample was taken out of the vacuum evaporation apparatus used for organic thin films, was then contained in a vacuum evaporation apparatus used for metallic thin films via the atmosphere, and was evacuated to a degree of vacuum of $2.2 \times 10^{-3}$ Pa. Thereafter, gold was vapor-deposited through a metal mask 17, which has an electrode pattern whose channel length is 20 μm and whose channel width is 2 mm, in a state in which the substrate 12 was inclined at an angle of 45 degrees with respect to an evaporation source by means of the metal mask 17 (FIG. 9(a)), and a gold layer having a film thickness of 50 nm was formed.

TABLE 1

| | Crystallinity control layer | Organic semiconductor layer | Type | field-effect mobility (cm²/Vs) | Mobility (cm²/Vs) indicated when the device is kept in the atmosphere for nine days |
|---|---|---|---|---|---|
| Example 1 | Pentacene | Compound (1) | p | 1.2 | 0.34 |
| Example 2 | Anthracene | α-6T | p | 0.05 | 0.02 |
| Example 3 | Copper phthalocyanine | TCDI-C13 | n | 0.06 | 0.01 |
| Comparative Example 1 | None | Compound (1) | p | No transistor characteristics | No transistor characteristics |
| Comparative Example 2 | None | Pentacene | p | 0.38 | $1 \times 10^{-3}$ |
| Comparative Example 3 | Pentacene (30 nm) | Compound (1) | p | 0.1 An electric current flowed through pentacene | 0.001 |

Figure 9A:
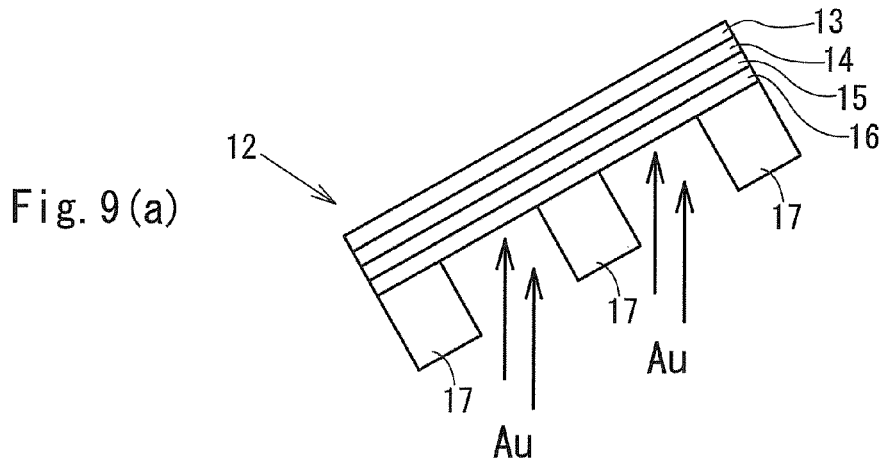
FIG. 9 is a view showing a manufacturing process of an organic thin film light-emitting transistor according to Example 4 of the present invention.
Figure 9B:
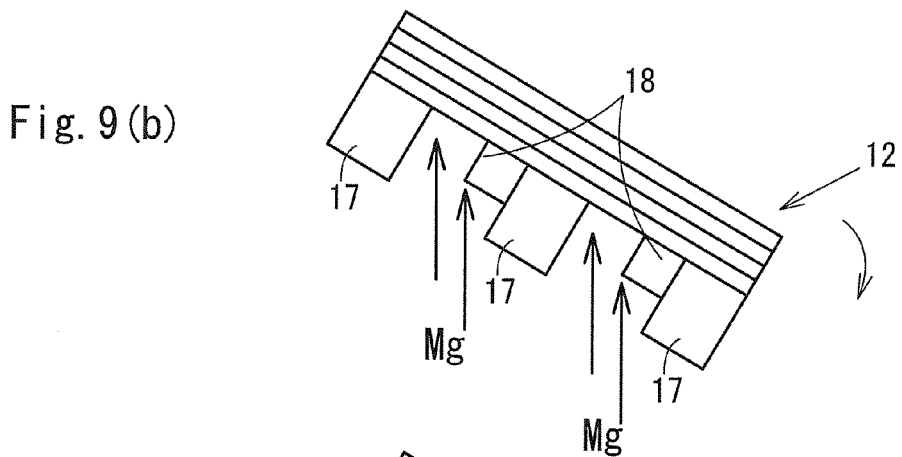
Figure 9C:
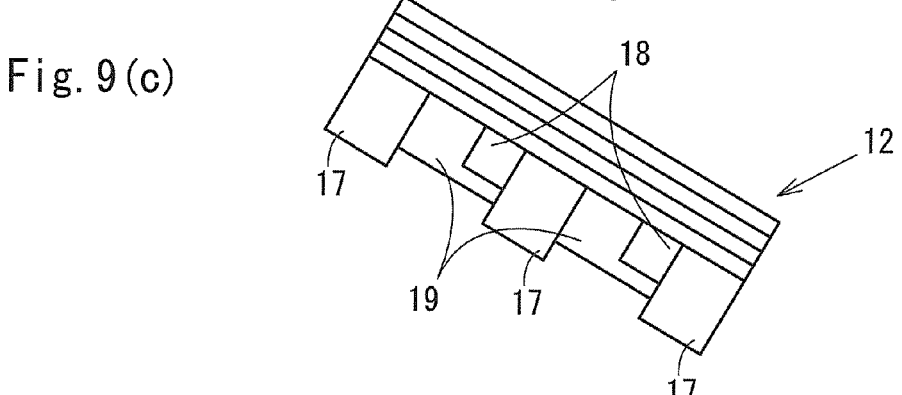
Figure 9D:
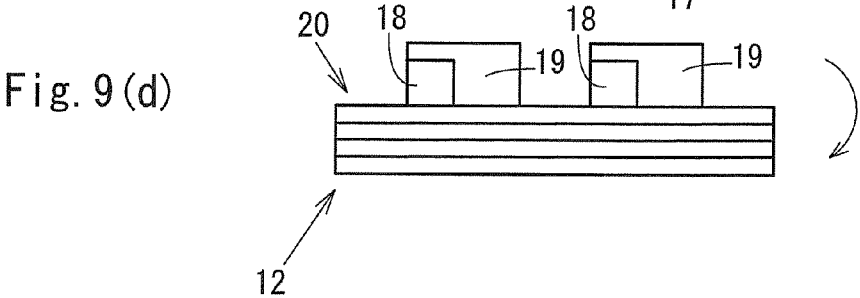
Figure 10:
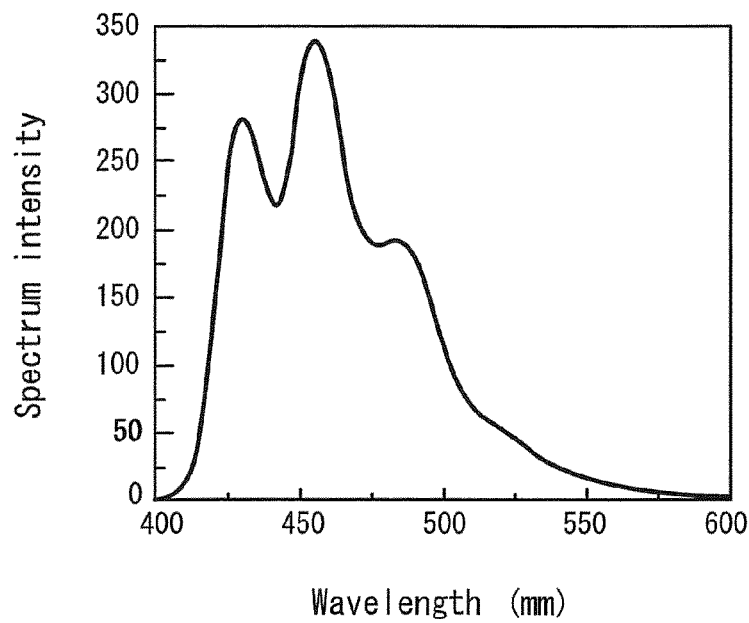
FIG. 10 is a view showing an emission spectrum of light emitted from an organic semiconductor layer according to Example 4 of the present invention.
Figure 11:
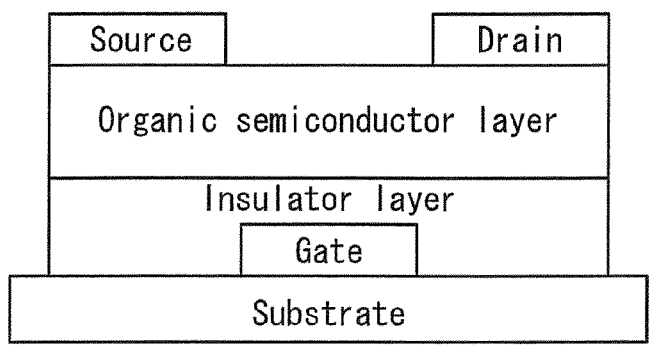
FIG. 11 is a view showing an example of a device structure of a generally-used organic TFT.

Thereafter, magnesium was vapor-deposited in a state in which the substrate 12 was inclined at an angle of 45 degrees in a direction opposite to the above-mentioned direction (FIG. 9(b)), and a magnesium layer having a film thickness of 100 nm was formed (FIG. 9(c)). As a result, an organic thin film light-emitting transistor 20 was produced that substantially includes a hole-injecting electrode 18 (Au) and an electron-injecting electrode 19 (Mg) both of which serve as a source electrode and a drain electrode not being in contact with each other (FIG. 9(d)). A voltage of −100 V was applied between the source and drain electrodes of the organic thin film light-emitting transistor 20 produced in this way, and a voltage of −100 V was applied to the gate electrode, and, as a result, 30-cd/m² blue green light was emitted from the organic semiconductor layer 16. The emission spectrum of light emitted from the organic semiconductor layer 16 is shown in FIG. 10.

INDUSTRIAL APPLICABILITY

As described in detail above, the organic TFT of the present invention has high mobility and high preservation stability, and therefore can fulfill high performance as a transistor, and can be suitably used as an organic thin film light-emitting transistor capable of emitting light.

The invention claimed is:

1. An organic thin film transistor comprising three kinds of terminals consisting of a gate electrode, a source electrode, and a drain electrode, an insulator layer that insulates the gate electrode from the source electrode and from the drain electrode, and an organic semiconductor layer; the terminals, the insulator layer, and the organic semiconductor layer being disposed on a substrate; the organic thin film transistor controlling a source-to-drain electric current by a voltage applied to the gate electrode,
the organic thin film transistor characterized by further comprising a crystallinity control layer that is formed from a crystalline compound that controls crystallinity of the organic semiconductor layer;
the organic semiconductor layer being formed on the crystallinity control layer;
the organic semiconductor layer containing a compound having heterocyclic groups or containing a compound having a quinone structure.

2. The organic thin film transistor according to claim 1, characterized in that an average film thickness of the crystallinity control layer is from 0.01 nm to 10 nm, and a maximum film thickness of the crystallinity control layer in a source-to-drain channel is from 0.3 nm to 30 nm.

3. The organic thin film transistor according to claim 1, characterized in that the crystallinity control layer has grains that appear like islands.

4. The organic thin film transistor according to claim 1, characterized in that a difference between surface energy of the crystallinity control layer and surface energy of the organic semiconductor layer is 30 mN/m or less.

5. The organic thin film transistor according to claim 1, characterized in that the crystallinity control layer contains a crystalline compound composed of any one of a condensed ring compound, a hetero condensed ring compound, and an aromatic polycyclic compound each of which may have a substituent.

6. The organic thin film transistor according to claim 1, characterized in that the crystallinity control layer is made of a condensed ring compound whose carbon number is 6 to 60.

7. The organic thin film transistor according to claim 1, characterized in that the crystallinity control layer is made of a hetero condensed ring compound whose carbon number is 2 to 60.

8. The organic thin film transistor according to claim 1, characterized in that the organic semiconductor layer contains a compound having thiophene rings.

9. The organic thin film transistor according to claim 1, characterized in that the organic semiconductor layer contains a compound having a thienobenzene skeleton or a dithienobenzene skeleton.

10. The organic thin film transistor according to claim 1, characterized in that the organic semiconductor layer contains a compound expressed by general formula (I) shown below:

[Chemical Compound 1]

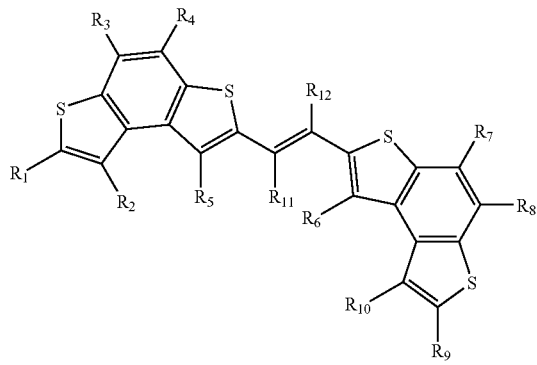

(1)

(In the formula, R1 to R10 each independently denote hydrogen atom, halogen atom, cyano group, alkyl group whose carbon number is 1 to 30, haloalkyl group whose carbon number is 1 to 30, alkoxyl group whose carbon number is 1 to 30, haloalkoxyl group whose carbon number is 1 to 30, alkylamino group whose carbon number is 1 to 30, dialkylamino group whose carbon number is 2 to 60 (alkyl groups may be connected together so as to form a ring structure having nitrogen atoms), alkylsulfonyl group whose carbon number is 1 to 30, haloalkylsulphonyl group whose carbon number is 1 to 30, alkylthio group whose carbon number is 1 to 30, haloalkylthio group whose carbon number is 1 to 30, alkylsilyl group whose carbon number is 3 to 30, aromatic hydrocarbon group whose carbon number is 6 to 60, and aromatic heterocyclic group whose carbon number is 1 to 60, and these groups may have substituents.).

11. An organic thin film light-emitting transistor, characterized by having a structure of the organic thin film transistor of claim 1, and characterized in that either one of the source electrode and the drain electrode of the organic thin film transistor is formed of a hole-injecting electrode, and the other electrode is formed of an electron-injecting electrode.

* * * * *